US012622043B2

(12) United States Patent
Lo et al.

(10) Patent No.: US 12,622,043 B2
(45) Date of Patent: May 5, 2026

(54) GATE ETCH BACK WITH REDUCED LOADING EFFECT

(71) Applicant: TAIWAN SEMICONDUCTOR MANUFACTURING CO., LTD., Hsinchu (TW)

(72) Inventors: Yi-Chen Lo, Hsinchu County (TW); Jung-Hao Chang, Taichung City (TW); Li-Te Lin, Hsinchu City (TW); Pinyen Lin, Rochester, NY (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 48 days.

(21) Appl. No.: 18/501,554

(22) Filed: Nov. 3, 2023

(65) Prior Publication Data

US 2024/0063288 A1    Feb. 22, 2024

Related U.S. Application Data

(60) Continuation of application No. 17/856,892, filed on Jul. 1, 2022, now Pat. No. 11,843,041, which is a
(Continued)

(51) Int. Cl.
H01L 21/3065    (2006.01)
H01J 37/00    (2006.01)
(Continued)

(52) U.S. Cl.
CPC ........... H10D 64/691 (2025.01); H01J 37/00 (2013.01); H01L 21/02274 (2013.01);
(Continued)

(58) Field of Classification Search
CPC ........... H01L 21/02274; H01L 21/0228; H01L 21/28088; H01L 21/3065; H01L 21/31122; H01L 21/32136; H01L 21/67069; H01J 37/00; H10D 30/0243; H10D 30/62; H10D 30/797; H10D 64/691; H10D 64/017; H10D 64/018; H10D 64/518; H10D 64/667;
(Continued)

(56) References Cited

U.S. PATENT DOCUMENTS 8,309,459 B1    11/2012  Wang et al.
10,056,303 B1    8/2018  Patil et al.
(Continued)

*Primary Examiner* — Omar F Mojaddedi
(74) *Attorney, Agent, or Firm* — Maschoff Brennan

(57) ABSTRACT

A semiconductor device includes first and second gate structures over a substrate, the first gate structure has a first width that is smaller than a second width of the second gate structure, in which a lower portion of the first gate structure having a first work-function material (WFM) layer, the first WFM layer having a top surface, a lower portion of the second gate structure having a second WFM layer, the second WFM layer having a top surface. A first gate electrode is disposed over the first WFM layer and a second gate electrode has a lower portion disposed in the second WFM layer, in which the first gate electrode has a first width that is smaller than a second width of the second gate electrode, and wherein the top surface of the second WFM layer is at a level below a top surface of the second gate electrode.

20 Claims, 25 Drawing Sheets

Related U.S. Application Data continuation of application No. 17/207,425, filed on Mar. 19, 2021, now Pat. No. 11,522,065, which is a division of application No. 16/158,141, filed on Oct. 11, 2018, now Pat. No. 10,957,779.

(60) Provisional application No. 62/592,801, filed on Nov. 30, 2017.

(51) Int. Cl.

| | |
|---|---|
| *H01L 21/02* | (2006.01) |
| *H01L 21/28* | (2006.01) |
| *H01L 21/311* | (2006.01) |
| *H01L 21/3213* | (2006.01) |
| *H01L 21/67* | (2006.01) |
| *H10D 30/01* | (2025.01) |
| *H10D 30/62* | (2025.01) |
| *H10D 64/01* | (2025.01) |
| *H10D 64/27* | (2025.01) |
| *H10D 64/68* | (2025.01) |
| *H10D 84/01* | (2025.01) |
| *H10D 84/03* | (2025.01) |
| *H10D 84/83* | (2025.01) |
| *H10D 30/69* | (2025.01) |
| *H10D 62/822* | (2025.01) |
| *H10D 64/66* | (2025.01) |
| *H10D 86/00* | (2025.01) |
| *H10D 86/01* | (2025.01) |

(52) U.S. Cl.
CPC .... *H01L 21/0228* (2013.01); *H01L 21/28088* (2013.01); *H01L 21/3065* (2013.01); *H01L 21/31122* (2013.01); *H01L 21/32136* (2013.01); *H01L 21/67069* (2013.01); *H10D 30/0243* (2025.01); *H10D 30/62* (2025.01); *H10D 64/017* (2025.01); *H10D 64/018* (2025.01); *H10D 64/518* (2025.01); *H10D 84/0158* (2025.01); *H10D 84/038* (2025.01); *H10D 84/834* (2025.01); *H10D 30/797* (2025.01); *H10D 62/822* (2025.01); *H10D 64/667* (2025.01); *H10D 86/011* (2025.01); *H10D 86/215* (2025.01)

(58) Field of Classification Search
CPC ............ H10D 62/822; H10D 84/0158; H10D 84/038; H10D 84/834; H10D 86/011; H10D 86/215
See application file for complete search history.

(56) References Cited

U.S. PATENT DOCUMENTS

| | | | |
|---|---|---|---|
| 2012/0139061 A1 | 6/2012 | Ramachandran et al. | |
| 2014/0377922 A1 | 12/2014 | Fung | |
| 2015/0145057 A1* | 5/2015 | Fan ................... | H01L 21/28088 |
| | | | 257/369 |
| 2015/0380407 A1* | 12/2015 | Ji ......................... | H10D 84/038 |
| | | | 257/369 |
| 2016/0064378 A1 | 3/2016 | Kwon | |
| 2016/0243518 A1 | 8/2016 | Spitzl | |
| 2016/0308112 A1* | 10/2016 | Tan ................... | H01J 37/32422 |
| 2016/0343706 A1* | 11/2016 | Chang ................. | H10D 64/667 |
| 2017/0287780 A1* | 10/2017 | Park ................. | H10D 84/0186 |
| 2020/0388707 A1 | 12/2020 | Shen et al. | |

* cited by examiner

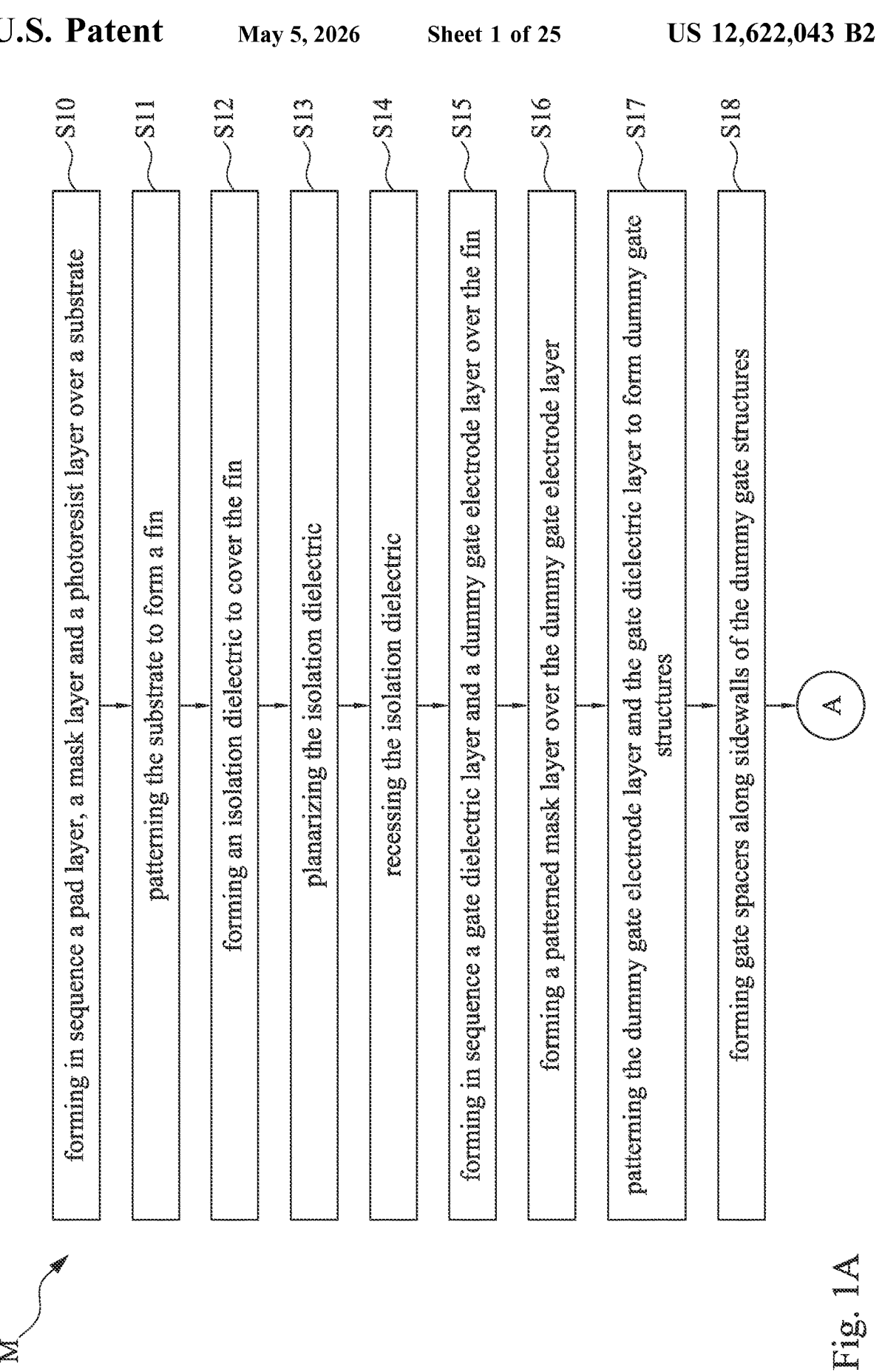

M

S10 forming in sequence a pad layer, a mask layer and a photoresist layer over a substrate S11 patterning the substrate to form a fin S12 forming an isolation dielectric to cover the fin S13 planarizing the isolation dielectric S14 recessing the isolation dielectric S15 forming in sequence a gate dielectric layer and a dummy gate electrode layer over the fin S16 forming a patterned mask layer over the dummy gate electrode layer S17 patterning the dummy gate electrode layer and the gate dielectric layer to form dummy gate structures S18 forming gate spacers along sidewalls of the dummy gate structures

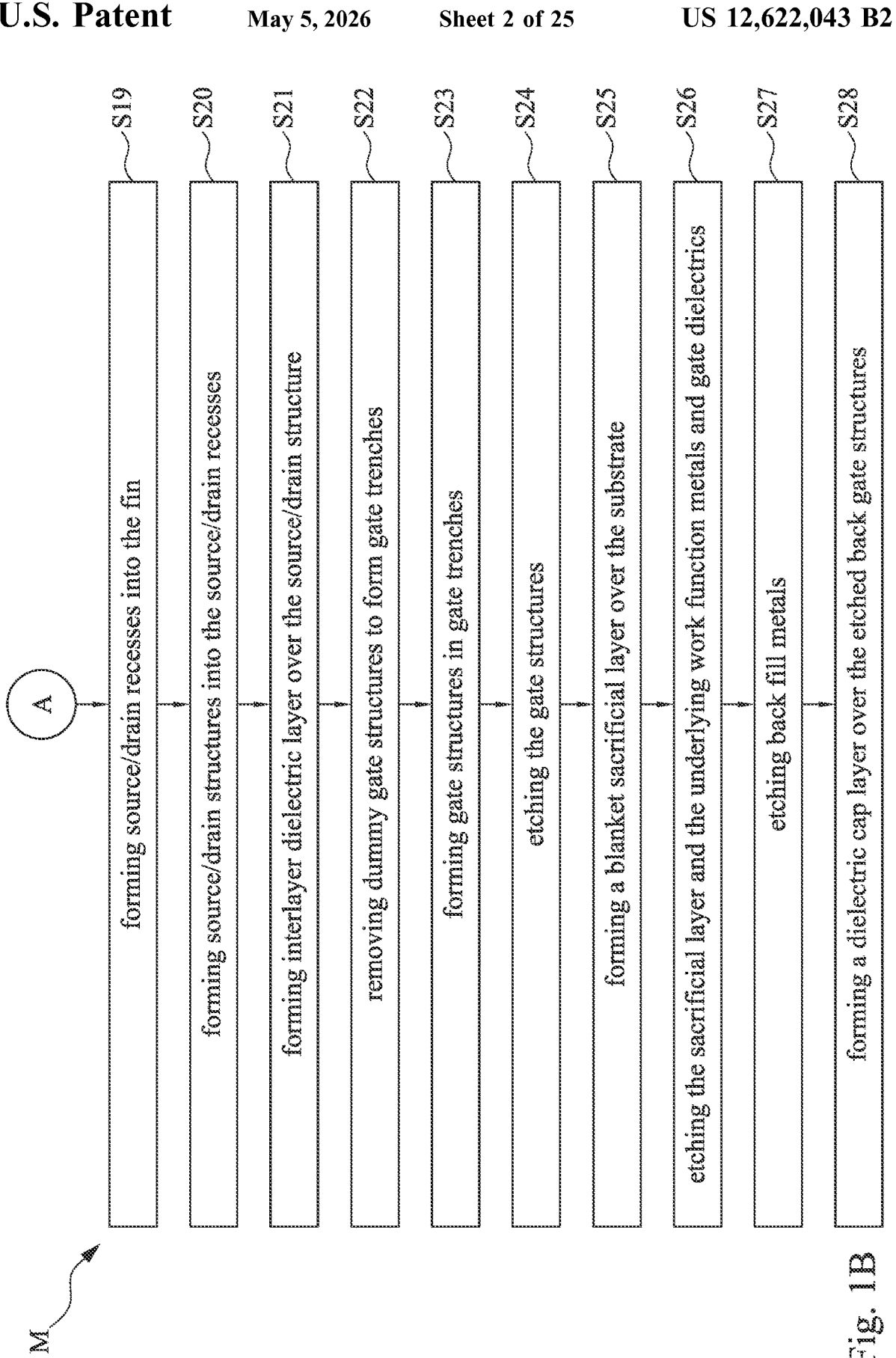

S19 forming source/drain recesses into the fin

S20 forming source/drain structures into the source/drain recesses

S21 forming interlayer dielectric layer over the source/drain structure

S22 removing dummy gate structures to form gate trenches

S23 forming gate structures in gate trenches

S24 etching the gate structures

S25 forming a blanket sacrificial layer over the substrate

S26 etching the sacrificial layer and the underlying work function metals and gate dielectrics S27 etching back fill metals S28 forming a dielectric cap layer over the etched back gate structures

Fig. 1B

GATE ETCH BACK WITH REDUCED LOADING EFFECT

PRIORITY CLAIM AND CROSS-REFERENCE

The present application is a Continuation application of U.S. application Ser. No. 17/856,892, filed on Jul. 1, 2022, which is a Continuation application of U.S. application Ser. No. 17/207,425, filed on Mar. 19, 2021, now U.S. Pat. No. 11,522,065, issued on Dec. 6, 2022, which is a Divisional application of U.S. application Ser. No. 16/158,141, filed on Oct. 11, 2018, now U.S. Pat. No. 10,957,779, issued on Mar. 23, 2021, which claims priority to U.S. Provisional Application Ser. No. 62/592,801, filed Nov. 30, 2017, which are herein incorporated by references.

BACKGROUND

As the semiconductor industry has strived for higher device density, higher performance, and lower costs, problems involving both fabrication and design have been encountered. One solution to these problems has been the development of a fin-like field effect transistor (FinFET). A FinFET includes a thin vertical 'fin' formed in a free standing manner over a major surface of a substrate. The source, drain, and channel regions are defined within this fin. The transistor's gate wraps around the channel region of the fin. This configuration allows the gate to induce current flow in the channel from three sides. Thus, FinFET devices have the benefit of higher current flow and reduced short-channel effects.

The dimensions of FinFETs and other metal oxide semiconductor field effect transistors (MOSFETs) have been progressively reduced as technological advances have been made in integrated circuit materials. For example, high-k metal gate (HKMG) processes have been applied to FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 1B illustrate a block diagram of a method of forming a semiconductor device in accordance with some embodiments.

DETAILED DESCRIPTION

Figure 2:
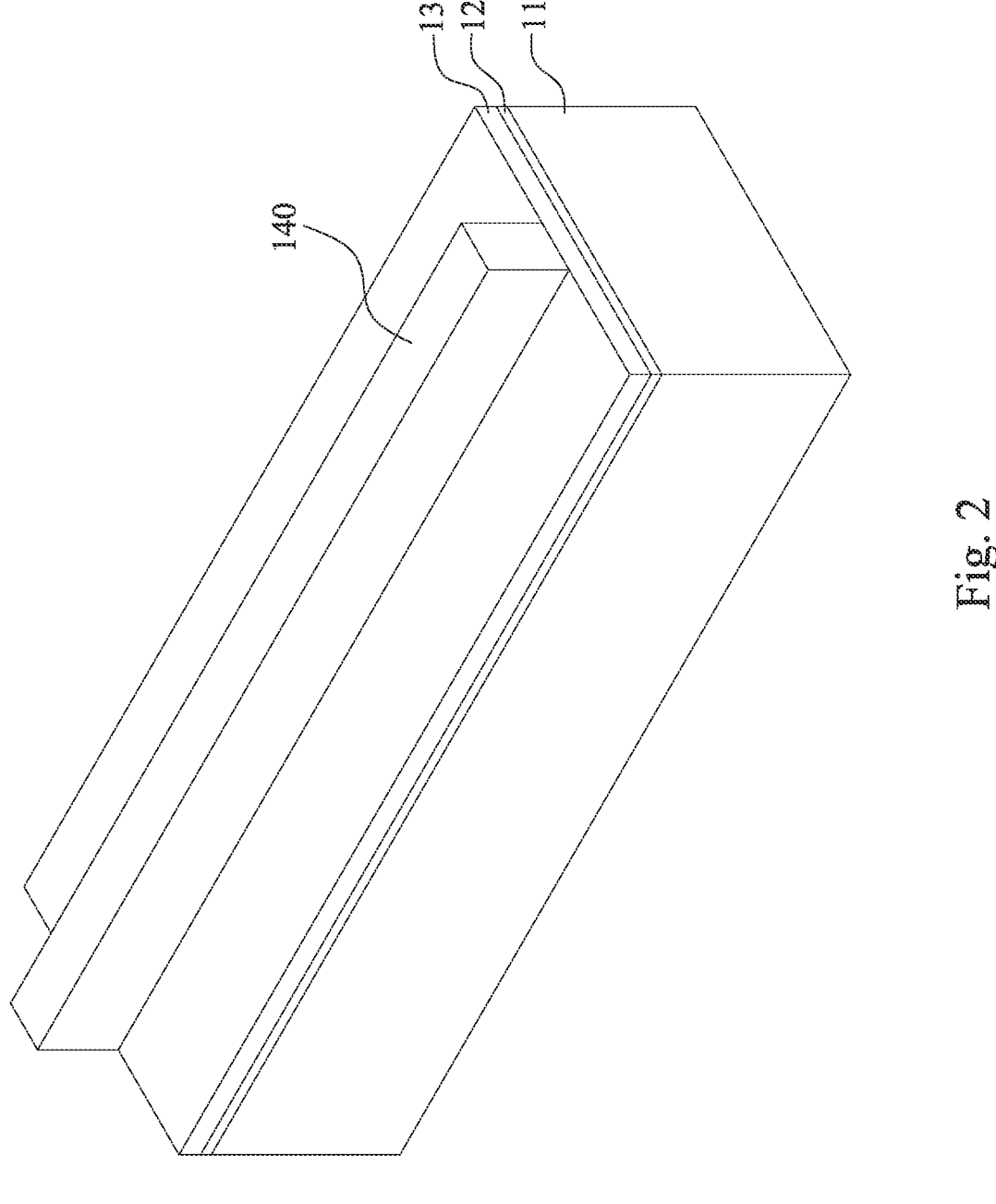
FIGS. 2-15 are perspective views of a wafer W at various stages of the method in FIGS. 1A to 1B.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide an improved metal gate etch back (MGEB) process, which may be employed in any of a variety of device types. For example, embodiments of the present disclosure may be used to form gate stacks suitable for use in planar bulk metal-oxide-semiconductor field-effect transistors (MOSFETs), multi-gate transistors (planar or vertical) such as FinFET devices, gate-all-around (GAA) devices, Omega-gate ($\Omega$-gate) devices, or Pi-gate ($\Pi$-gate) devices, as well as strained-semiconductor devices, silicon-on-insulator (SOI) devices, partially-depleted SOI devices, fully-depleted SOI devices, or the like. In addition, embodiments disclosed herein may be employed in the formation of P-type and/or N-type devices.

Referring now to FIGS. 1A and 1B, illustrated are an exemplary method M for fabrication of a semiconductor device in accordance with some embodiments, wherein the fabrication includes the improved MGEB process. The method M includes a relevant part of the entire manufacturing process. It is understood that additional operations may be provided before, during, and after the operations shown by FIGS. 1A and 1B, and some of the operations described below can be replaced or eliminated for additional embodiments of the method. The order of the operations/processes may be interchangeable. The method M includes fabrication of a FinFET device. However, the fabrication of FinFET device is merely example for describing the improved MGEB process according to some embodiments of the present disclosure.

FIGS. 2 to 23 illustrate a wafer W at various stages of the method M according to some embodiments of the present disclosure. The method M begins at block S10 where a pad layer, a mask layer and a photoresist layer are formed in sequence over a substrate. Referring to FIG. 2, in some embodiments of block S10, a wafer W undergoes a series of deposition and photolithography processes, such that a pad layer 120, a mask layer 130 and a patterned photoresist layer 140 are formed on a substrate 110 of the wafer W. In some embodiments, the substrate 110 is a semiconductor substrate, such as a bulk semiconductor, a semiconductor-on-insulator (SOI) substrate, or the like. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multilayered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the pad layer 120 is a thin film comprising silicon oxide formed using, for example, a thermal oxidation process. The pad layer 120 may act as an adhesion layer between the substrate 110 and mask layer 130. The pad layer 120 may also act as an etch stop layer for etching the mask layer 130. In some embodiments, the mask layer 130 is formed of silicon nitride, for example, using low-pressure chemical vapor deposition (LPCVD) or plasma enhanced chemical vapor deposition (PECVD). The mask layer 130 is used as a hard mask during subsequent photolithography processes. A photoresist layer 140 is formed on the mask layer 130 and is then patterned, forming openings in the photoresist layer 140, so that regions of the mask layer 130 are exposed.

Figure 3:

Returning to FIG. 1A, the method M then proceeds to block S11 where the substrate is patterned to form one or more fins. With reference to FIG. 3, in some embodiments of block S11, the mask layer 130 and pad layer 120 are etched through the photoresist layer 140, exposing underlying substrate 110. The exposed substrate 110 is then etched, forming trenches T. A portion of the substrate 110 between neighboring trenches T can be referred to as a fin 150. After etching the substrate 110, the photoresist layer 140 is removed. Next, a cleaning step may be optionally performed to remove a native oxide of the semiconductor substrate 110. The cleaning may be performed using diluted hydrofluoric (HF) acid, for example.

Figure 4:
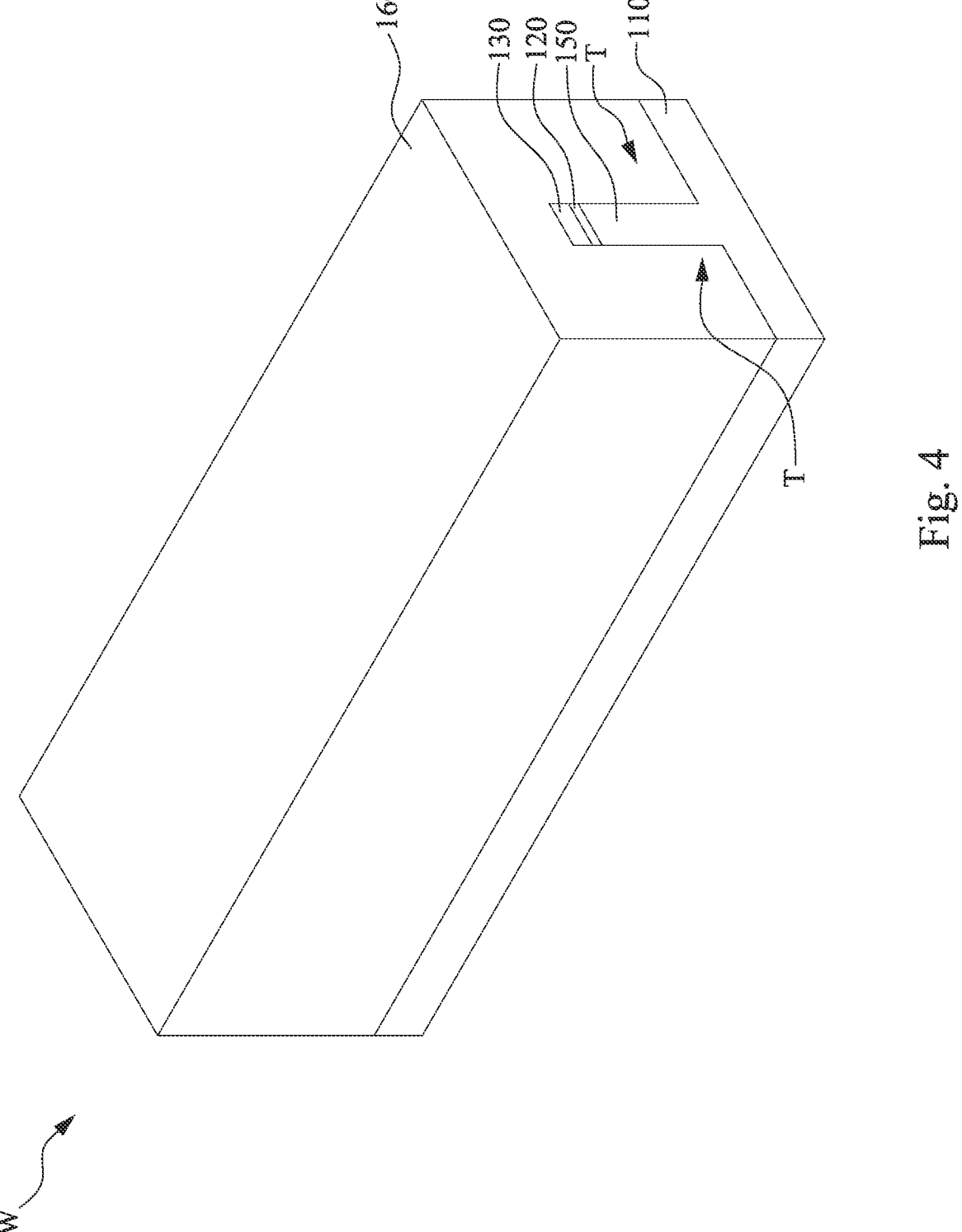

Returning to FIG. 1A, the method M then proceeds to block S12 where an isolation dielectric is formed to cover the fin. With reference to FIG. 4, an isolation dielectric 160 is formed to overfill the trenches and cover the fin 150. The isolation dielectric 160 in the trenches T can be referred to as a shallow trench isolation (STI) structure. In some embodiments, the isolation dielectric 160 is made of silicon oxide, silicon nitride, silicon oxynitride, fluoride-doped silicate glass (FSG), or other low-K dielectric materials. In some embodiments, the isolation dielectric 160 may be formed using a high-density-plasma (HDP) chemical vapor deposition (CVD) process, using silane ($SiH_4$) and oxygen ($O_2$) as reacting precursors. In some other embodiments, the isolation dielectric 160 may be formed using a sub-atmospheric CVD (SACVD) process or high aspect-ratio process (HARP), wherein process gases may comprise tetraethylorthosilicate (TEOS) and ozone ($O_3$). In yet other embodiments, the isolation dielectric 160 may be formed using a spin-on-dielectric (SOD) process, such as hydrogen silsesquioxane (HSQ) or methyl silsesquioxane (MSQ). Other processes and materials may be used. In some embodiments, the isolation dielectric 160 can have a multi-layer structure, for example, a thermal oxide liner layer with silicon nitride formed over the liner. Thereafter, a thermal annealing may be optionally performed to the isolation dielectric 160.

Figure 5:
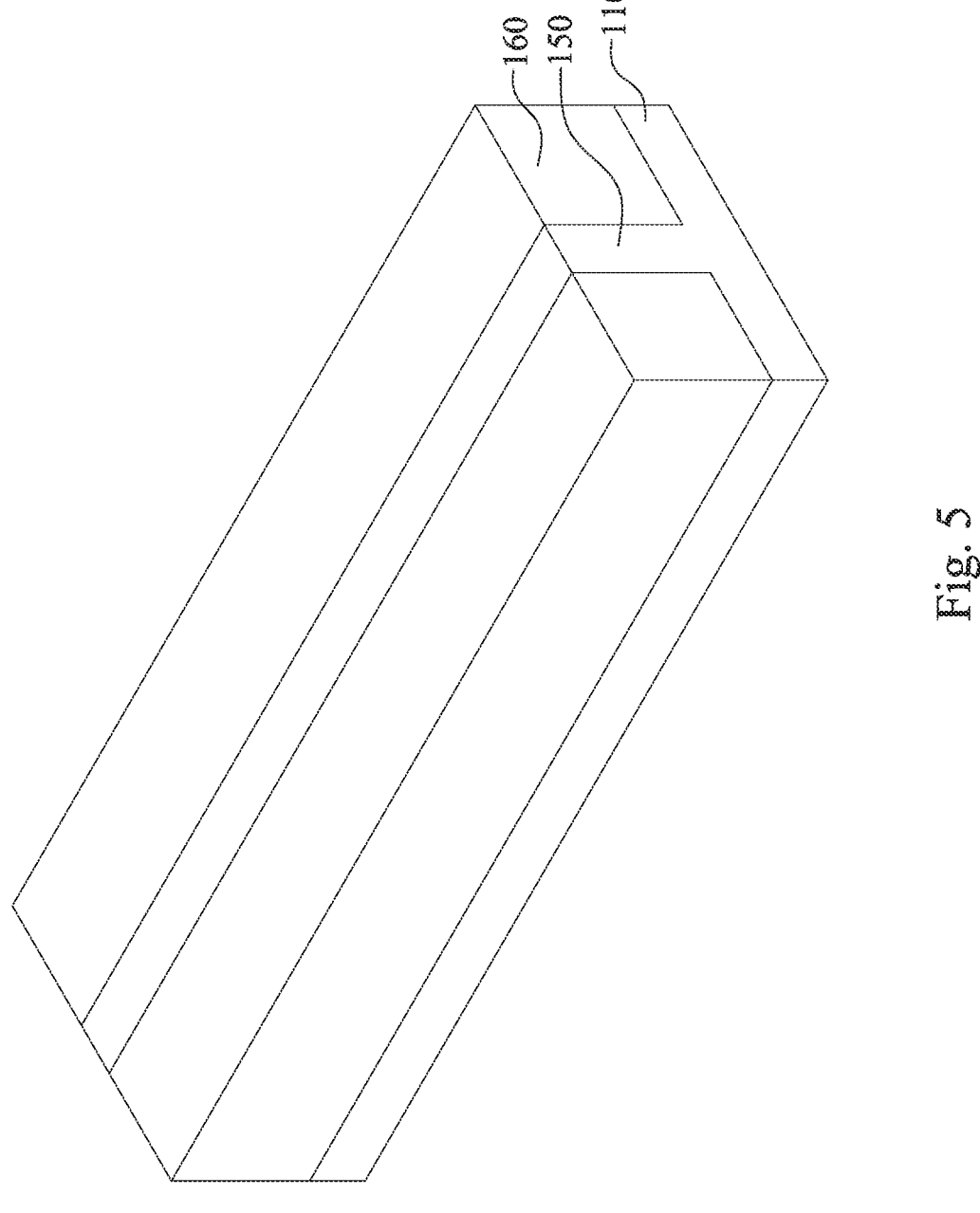

Returning to FIG. 1A, the method M then proceeds to block S13 where a planarization process is performed to the isolation dielectric. With reference to FIG. 5, a planarization process such as chemical mechanical polish (CMP) is performed to remove the excess isolation dielectric 160 over the fin 150. In some embodiments, the planarization process may also remove the mask layer 130 and the pad layer 120 such that a top surface of the fin 150 is exposed. In some other embodiments, the planarization process stops when the mask layer 130 is exposed. In such embodiments, the mask layer 130 may act as the CMP stop layer in the planarization. If the mask layer 130 and the pad layer 120 are not removed by the planarization process, the mask layer 130, if formed of silicon nitride, may be remove by a wet process using hot $H_3PO_4$, and the pad layer 120, if formed of silicon oxide, may be removed using diluted HF.

Figure 6:

Returning to FIG. 1A, the method M then proceeds to block S14 where the isolation dielectric is recessed. With reference to FIG. 6, the isolation dielectric 160 is recessed, for example, through an etching operation, wherein diluted HF, SiCoNi (including HF and $NH_3$), or the like, may be used as the etchant. After recessing the isolation dielectric 160, a portion of the fin 150 is higher than a top surface of the isolation dielectric 160.

It is understood that the blocks S10-S14 described above are merely an example of how the fin 150 and the STI structure 160 are formed. In other embodiments, a dielectric layer can be formed over a top surface of the substrate 110; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fin. For example, the semiconductor fin 150 can be recessed, and a material different from the recessed semiconductor fin 150 is epitaxially grown in its place. In even further embodiments, a dielectric layer can be formed over a top surface of the substrate 110; trenches can be etched through the dielectric layer; heteroepitaxial structures can be epitaxially grown in the trenches using a material different from the substrate 110; and the dielectric layer can be recessed such that the heteroepitaxial structures protrude from the dielectric layer to form fins. In some embodiments where homoepitaxial or heteroepitaxial structures are epitaxially grown, the grown materials may be in-situ doped during growth, which may obviate prior implanting of the fins although in-situ and implantation doping may be used together. In some embodiments, the semiconductor fin 150 may include silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, or the like.

Figure 7:
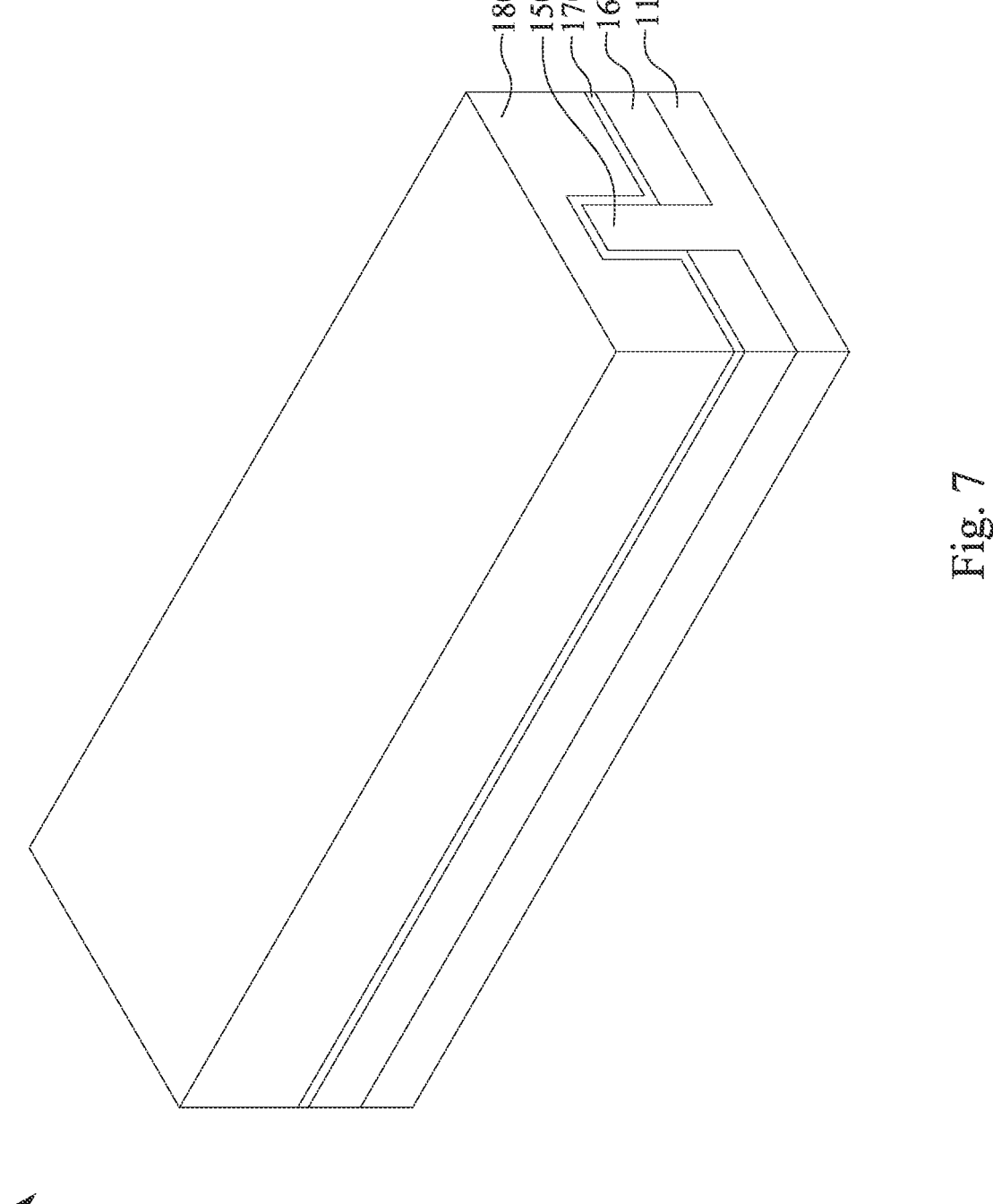

Returning to FIG. 1A, the method M then proceeds to block S15 where a gate dielectric layer and a dummy gate electrode layer are formed in sequence over the fin. With reference to FIG. 7, a gate dielectric layer 170 is blanket formed over the substrate 110 to cover the semiconductor fin 150 and the isolation dielectric 160, and a dummy gate electrode layer 180 is formed over the gate dielectric layer 170. In some embodiments, the gate dielectric layer 170 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 170 is an oxide layer. The gate dielectric layer 170 may be formed by a deposition processes, such as chemical vapor deposition (CVD), physical vapor deposition (PVD), atomic layer deposition (ALD), plasma enhanced CVD (PECVD) or other suitable techniques.

In some embodiments, the dummy gate electrode layer 180 may include polycrystalline-silicon (poly-Si), poly-crystalline silicon-germanium (poly-SiGe), metallic nitrides, metallic silicides, metallic oxides, or metals. In some embodiments, the dummy gate electrode layer 180 includes a metal-containing material such as TiN, TaN, TaC, Co, Ru, Al, combinations thereof, or multi-layers thereof. The dummy gate electrode layer 180 may be deposited by CVD, physical vapor deposition (PVD), sputter deposition, or other techniques suitable for depositing conductive materials.

Figure 8:
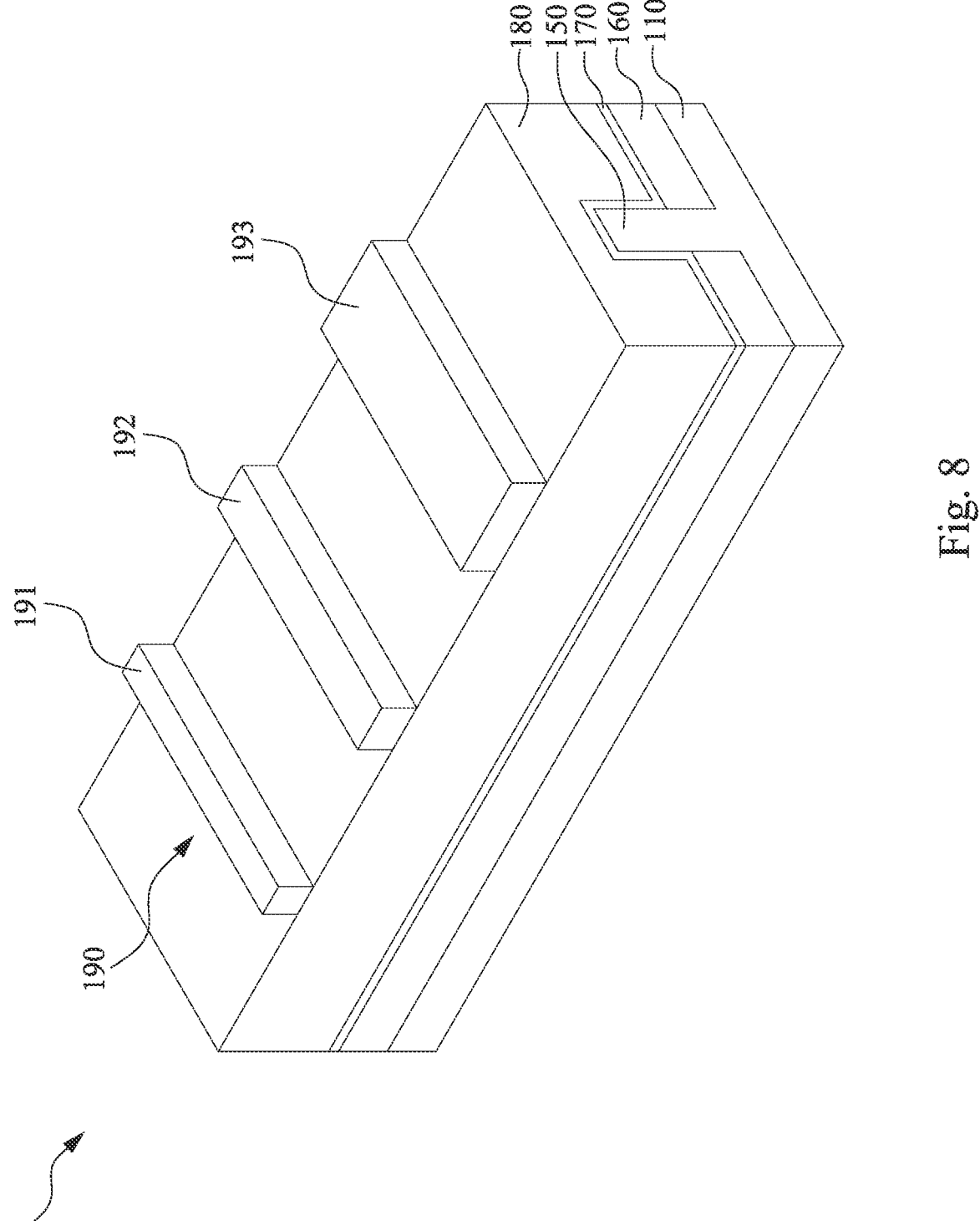

Returning to FIG. 1A, the method M then proceeds to block S16 where a patterned mask layer is formed over the dummy gate electrode layer. With reference to FIG. 8, in some embodiments of block S16, a mask layer 190 is formed over the dummy gate electrode layer 180 and then patterned to form first, second and third mask portions 191 192 and 193. The first mask portion 191 has a width less than a width of the second mask portion 192, and the width of the second mask portion 192 is less than a width of the third mask portion 193. The mask portions 191-193 protect underlying portions of dummy gate electrode layer 180 and the gate dielectric layer 170 against subsequent etching process. Therefore, the illustrated width difference among the mask portions 191-193 results in subsequently formed gate electrodes with different widths. The patterned mask layer 190 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 9:
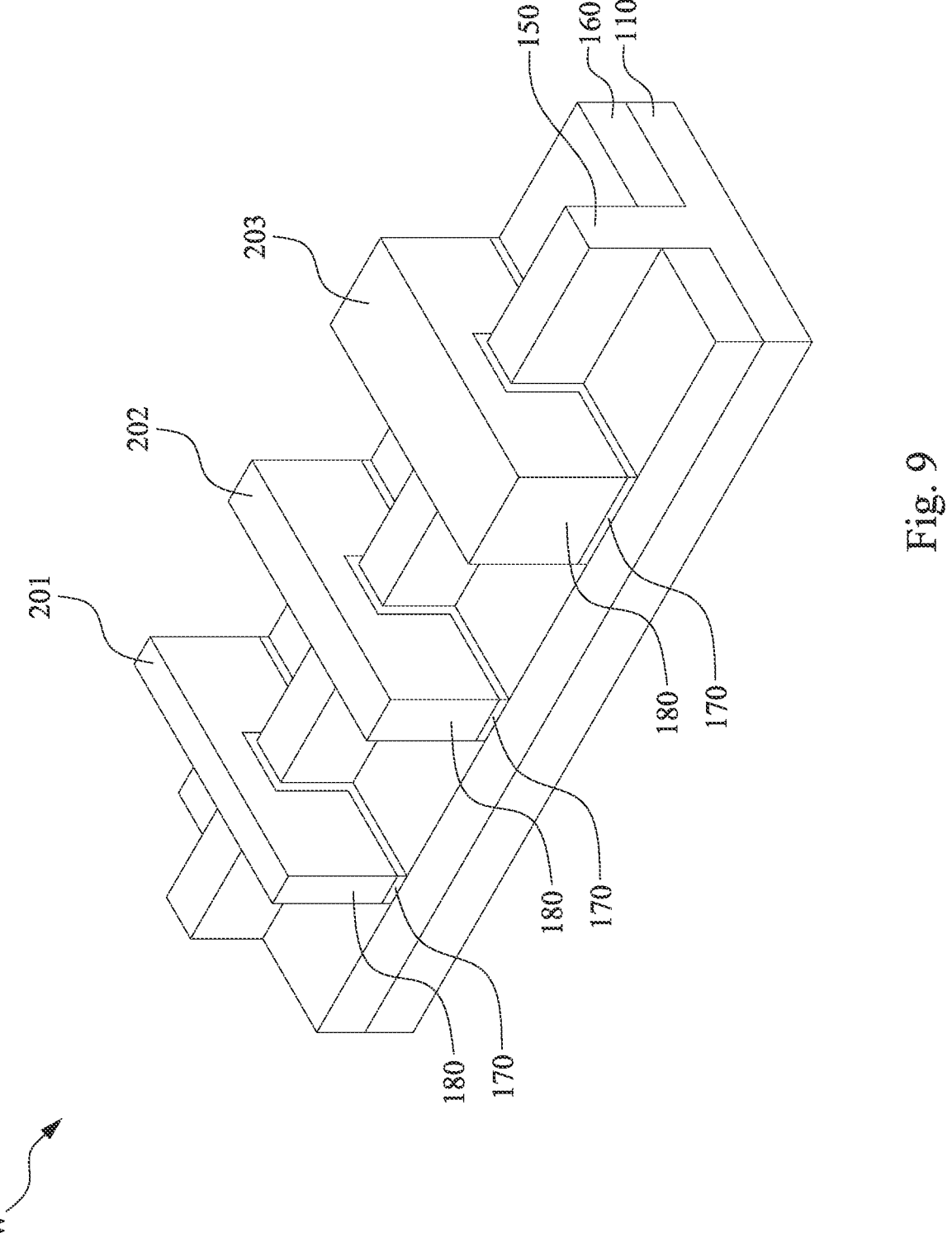

Returning to FIG. 1A, the method M then proceeds to block S17 where the dummy gate electrode layer and the gate dielectric layer are patterned to form dummy gate structures. With reference to FIG. 9, in some embodiments of block S17, one or more etching processes are performed to form first, second and third dummy gate structures 201, 202 and 203 wrapping around the semiconductor fin 150 using the patterned mask 190 as an etching mask, and the patterned mask layer 190 is removed after the etching. Each dummy gate structure includes a gate dielectric layer 170 and a dummy gate electrode layer 180 over the gate dielectric layer 170. The dummy gate structures 201-203 have substantially parallel longitudinal axes that are substantially perpendicular to a longitudinal axis of the semiconductor fin 150. Widths of the dummy gate structures 201-203 are associated with widths of the corresponding mask portions 191-193, and hence the first dummy gate structure 201 has a width less than a width of the second dummy gate structure 202, and the width of the second dummy gate structure 202 is less than a width of the third dummy gate structure 203. The dummy gate structures 201-203 will be replaced with a replacement gate structure using a "gate-last" or replacement-gate process.

Figure 10:
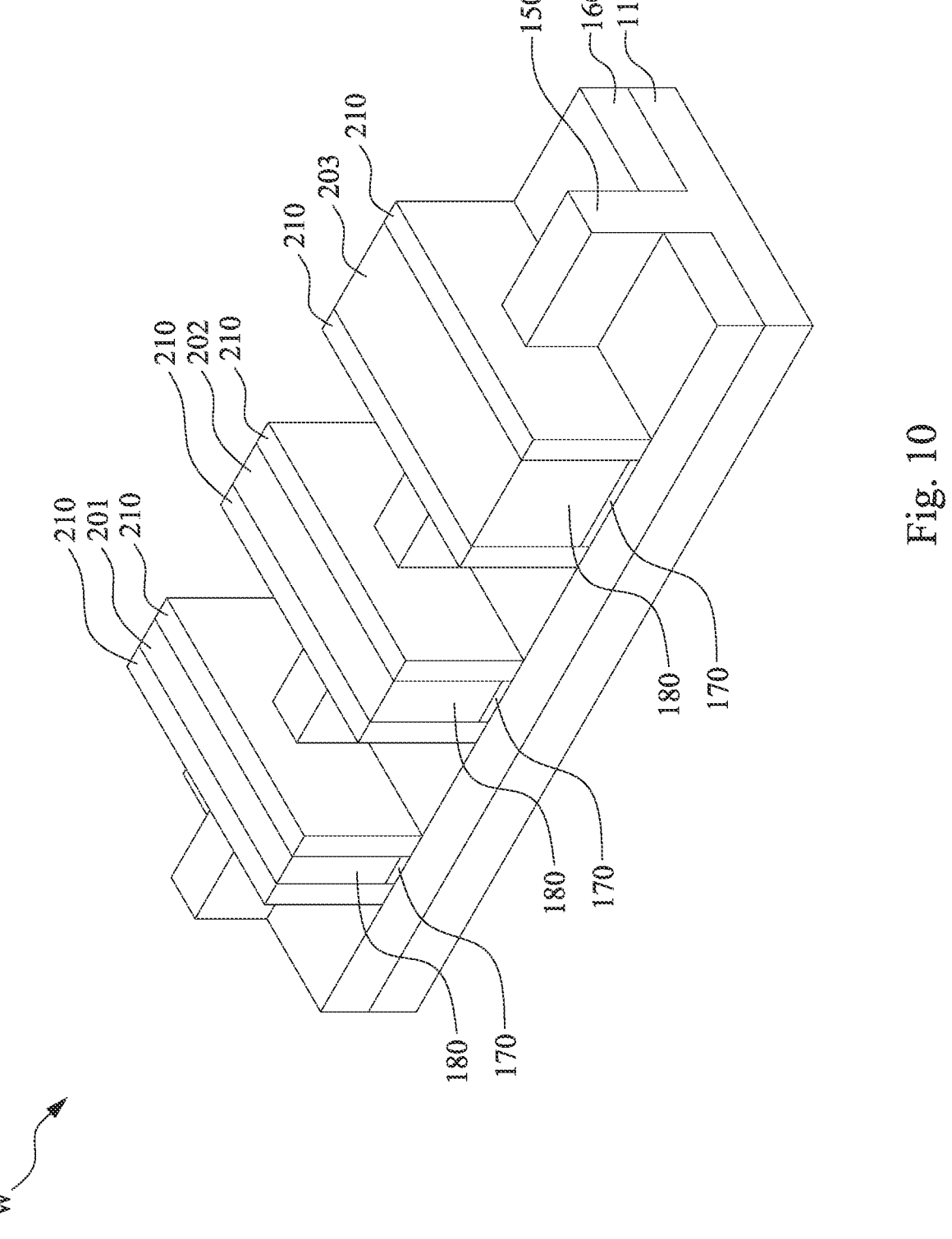

Returning to FIG. 1A, the method M then proceeds to block S18 where gate spacers are formed along sidewalls of the dummy gate structures. With reference to FIG. 10, in some embodiments of block S18, gate spacers 210 are formed along sidewalls of the dummy gate structures 201-

203. In some embodiments, the gate spacers 210 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials. The gate spacers 210 may include a single layer or multilayer structure made of different dielectric materials. The method of forming the gate spacers 210 includes blanket forming a dielectric layer on the structure shown in FIG. 10 using, for example, CVD, PVD or ALD, and then performing an etching process such as anisotropic etching to remove horizontal portions of the dielectric layer. The remaining portions of the dielectric layer on sidewalls of the dummy gate structures 201-203 can serve as the gate spacers 210. In some embodiments, the gate spacers 210 may be used to offset subsequently formed doped regions, such as source/drain regions. The gate spacers 210 may further be used for designing or modifying the source/drain region profile.

Figure 11:
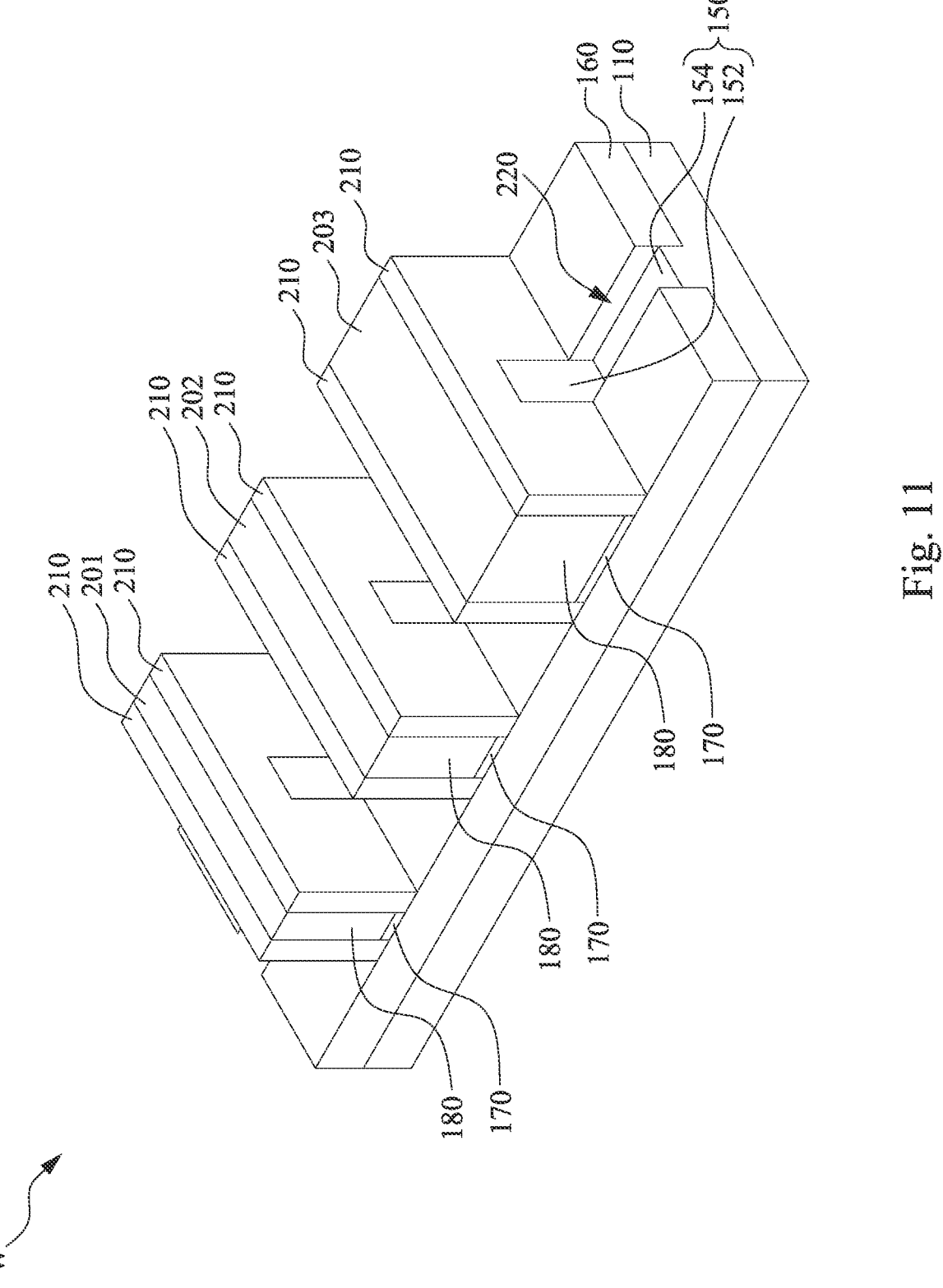

Referring to FIG. 1B, the method M then proceeds to block S19 where source/drain recesses are formed into the fin. With reference to FIG. 11, in some embodiments of block S19, portions of the semiconductor fin 150 not covered by the dummy gate structures 201-203 and the gate spacers 210 are recessed to form recesses 220. The remaining semiconductor fin 150 has protruding portions 152 and embedded portions 154 after this removal. The embedded portions 154 are embedded in the isolation dielectric 160 and under the recesses 220. The protruding portions 152 protrude from the embedded portions 154. The dummy gate structures 201-203 wrap around the protruding portions 152, and hence the protruding portions 152 can act as channel regions of transistors. The embedded portions 154 separated from the dummy gate structures 201-203 can act as source/drain regions of transistors.

Formation of the recesses 220 may include a dry etching process, a wet etching process, or combination dry and wet etching processes. This etching process may include reactive ion etch (RIE) using the dummy gate structures 201-203 and gate spacers 210 as masks, or by any other suitable removal process. After the etching process, a pre-cleaning process may be performed to clean the recesses 220 with hydrofluoric acid (HF) or other suitable solution in some embodiments.

Figure 12:
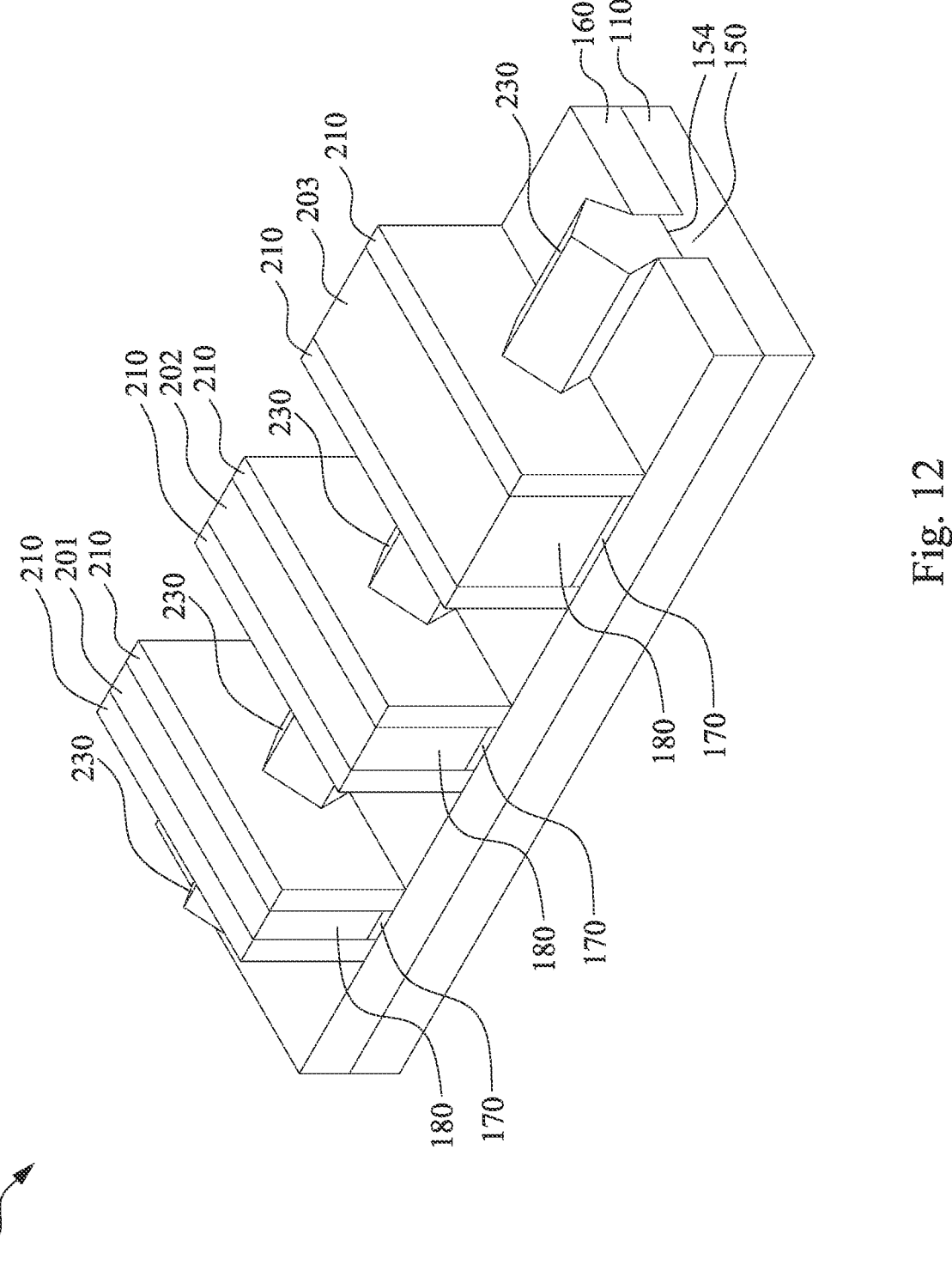

Returning to FIG. 1B, the method M then proceeds to block S20 where source/drain structures are formed into the recesses. With reference to FIG. 12, in some embodiments of block S20, epitaxial source/drain structures 230 are respectively formed in the recesses 220. The epitaxial source/drain structures 230 may be formed using one or more epitaxy or epitaxial (epi) processes, such that Si features, SiGe features, silicon phosphorus (SiP) features, silicon carbide (SiC) features and/or other suitable features can be formed in a crystalline state on the embedded portions 154 of the semiconductor fins 150. In some embodiments, lattice constants of the epitaxial source/drain structures 230 are different from that of the semiconductor fin 150, so that the channel region between the epitaxial source/drain structures 230 can be strained or stressed by the epitaxial source/drain structures 230 to improve carrier mobility of the semiconductor device and enhance the device performance.

The epitaxy process includes CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 150 (e.g., silicon, silicon germanium, silicon phosphorus, or the like). The epitaxial source/drain structures 230 may be in-situ doped. The doping species include p-type dopants, such as boron or $BF_2$; n-type dopants, such as phosphorus or arsenic; and/or other suitable dopants including combinations thereof. If the epitaxial source/drain structures 230 are not in-situ doped, an implantation process is performed to dope the epitaxial source/drain structures 230. One or more annealing processes may be performed to activate the epitaxial source/drain structures 230. The annealing processes include rapid thermal annealing (RTA) and/or laser annealing processes.

Figure 13:
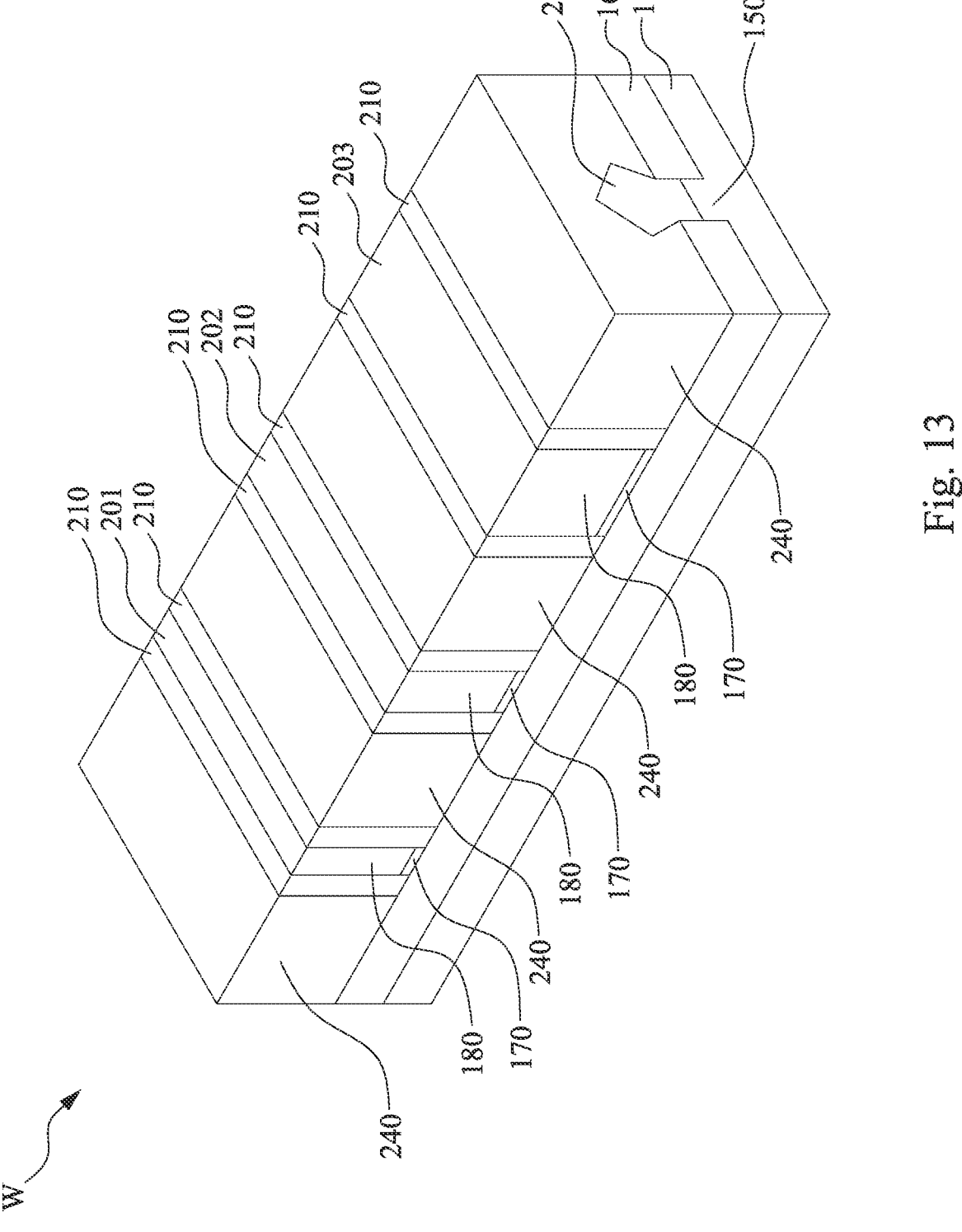

Returning to FIG. 1B, the method M then proceeds to block S21 where an interlayer dielectric (ILD) layer is formed over the source/drain structures. With reference to FIG. 13, in some embodiments of block S21, an ILD layer 240 is formed over the source/drain structures 230, the dummy gate structures 201-203 and the gate spacers 210, and a CMP process is then performed to remove excessive material of the ILD layer 240 to expose the dummy gate structures 201-203. The CMP process may planarize a top surface of the ILD layer 240 with top surfaces of the dummy gate structures 201-203 and gate spacers 210. In some embodiments, the ILD layer 240 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 240 may be formed using, for example, CVD, ALD, spin-on-glass (SOG) or other suitable techniques. In some embodiments, a contact etch stop layer (CESL) is optionally formed over the source/drain structures 230 prior to forming the ILD layer 240, and the ILD layer 240 is then formed over the CESL. The CESL has a different material than the ILD layer 240. By way of example, the CESL includes silicon nitride, silicon oxynitride or other suitable materials. The CESL can be formed using, for example, plasma enhanced CVD, low pressure CVD, ALD or other suitable techniques.

Figure 14:
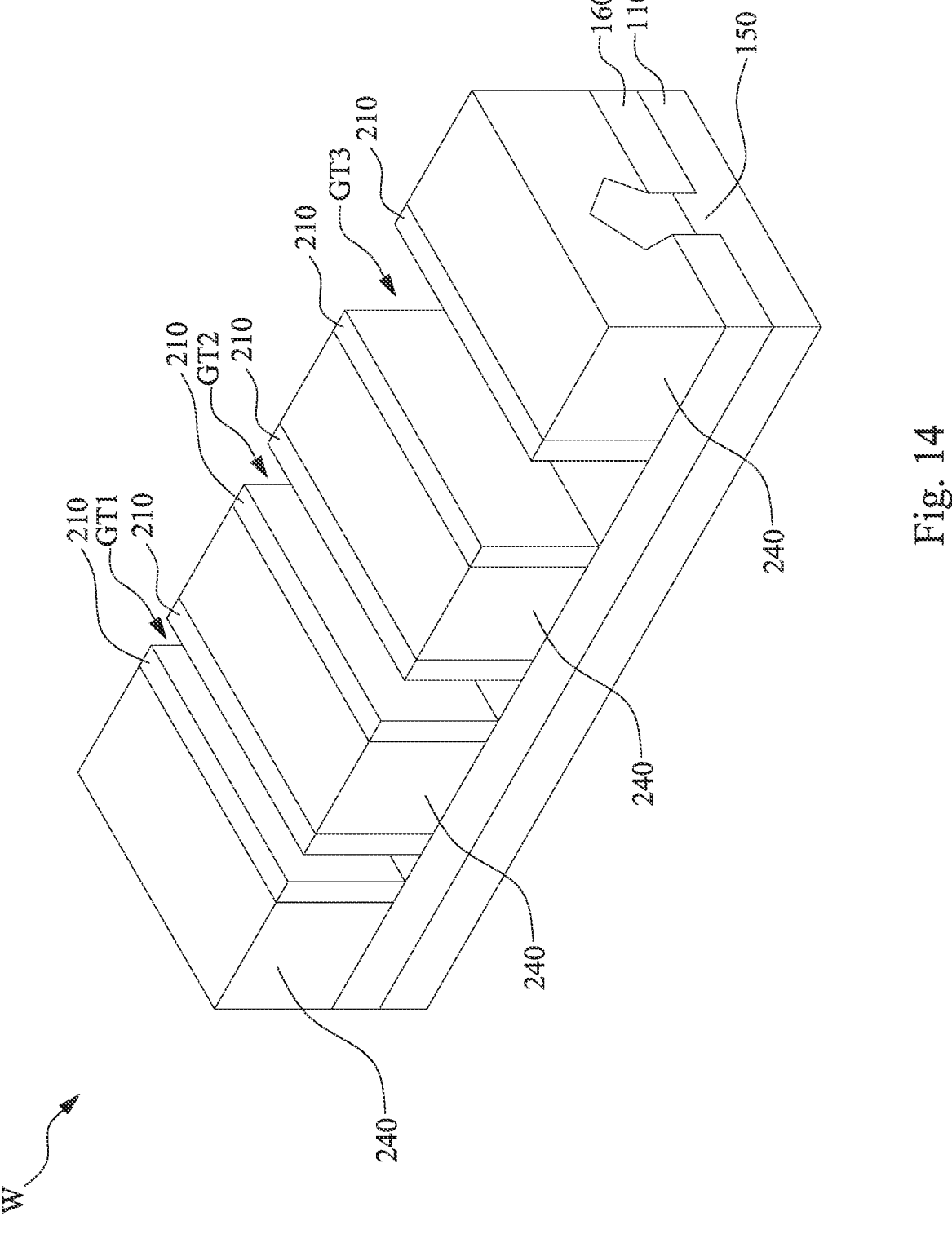

Returning to FIG. 1B, the method M then proceeds to block S22 where the dummy gate structures are removed to form gate trenches. With reference to FIG. 14, in some embodiments of block S22, dummy gate structures 201-203 (as shown in FIG. 13) are removed to form first, second and third gate trenches GT1, GT2 and GT3 with the gate spacers 210 as their sidewalls. Widths of the gate trenches GT1-GT3 are associated with the corresponding dummy gate structures 201-203, and hence the first gate trench GT1 has a width less than a width of the second gate trench GT2, and the width of the second gate trench GT2 is less than a width of the third gate trench GT3. In some embodiments, the dummy gate structures 201-203 are removed by performing a first etching process and performing a second etching process after the first etching process. In some embodiments, the dummy gate electrode layer 180 (as shown in FIG. 13) is mainly removed by the first etching process, and the gate dielectric layer 170 (as shown in FIG. 13) is mainly removed by the second etching process that employs a different etchant than that used in the first etching process. In some embodiments, the dummy gate electrode layer 180 is removed, while the gate dielectric layer 170 remains in the gate trenches GT1-GT3.

Returning to FIG. 1B, the method M then proceeds to block S23 where gate structures are formed in gate trenches.

Figure 15:
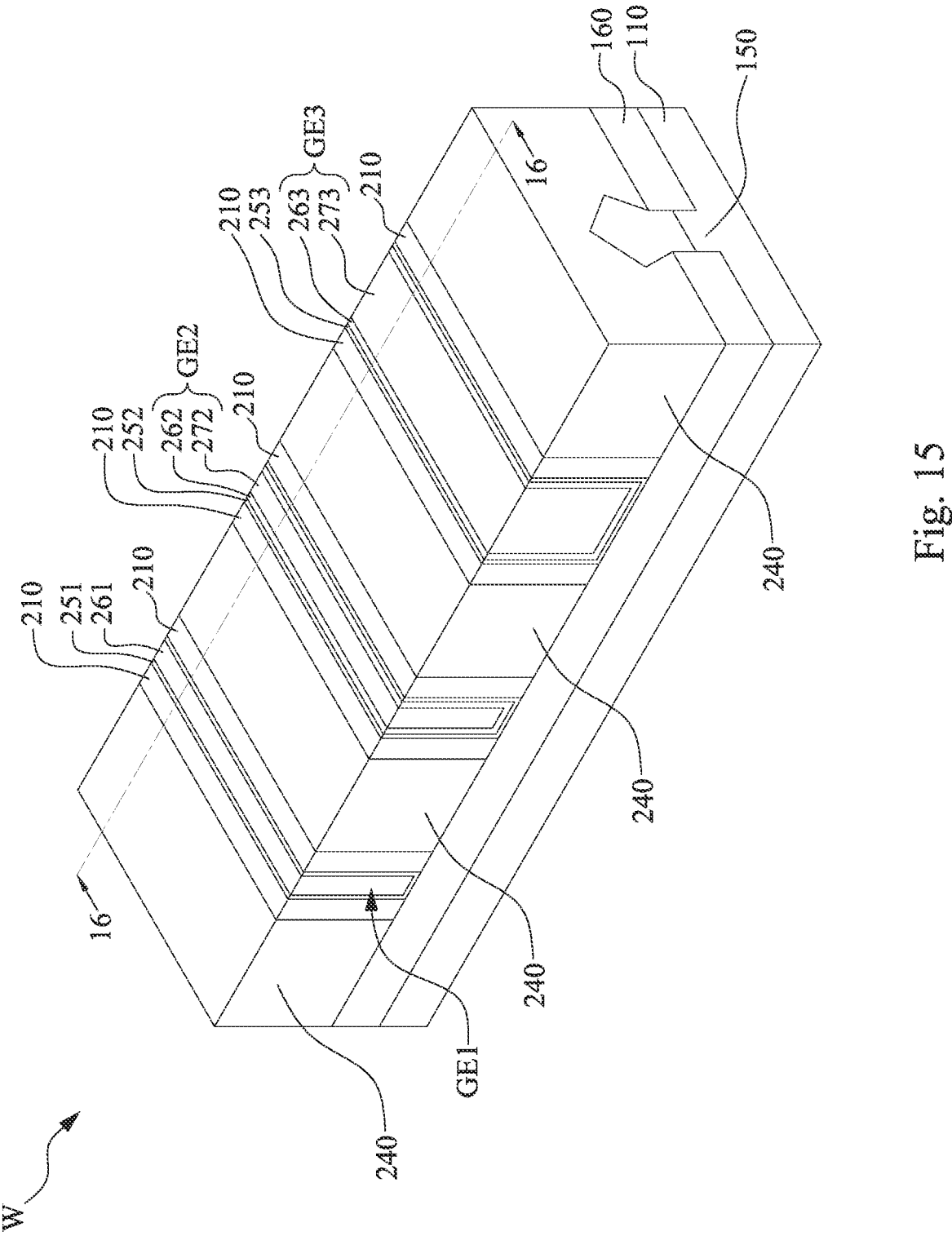
Figure 16:
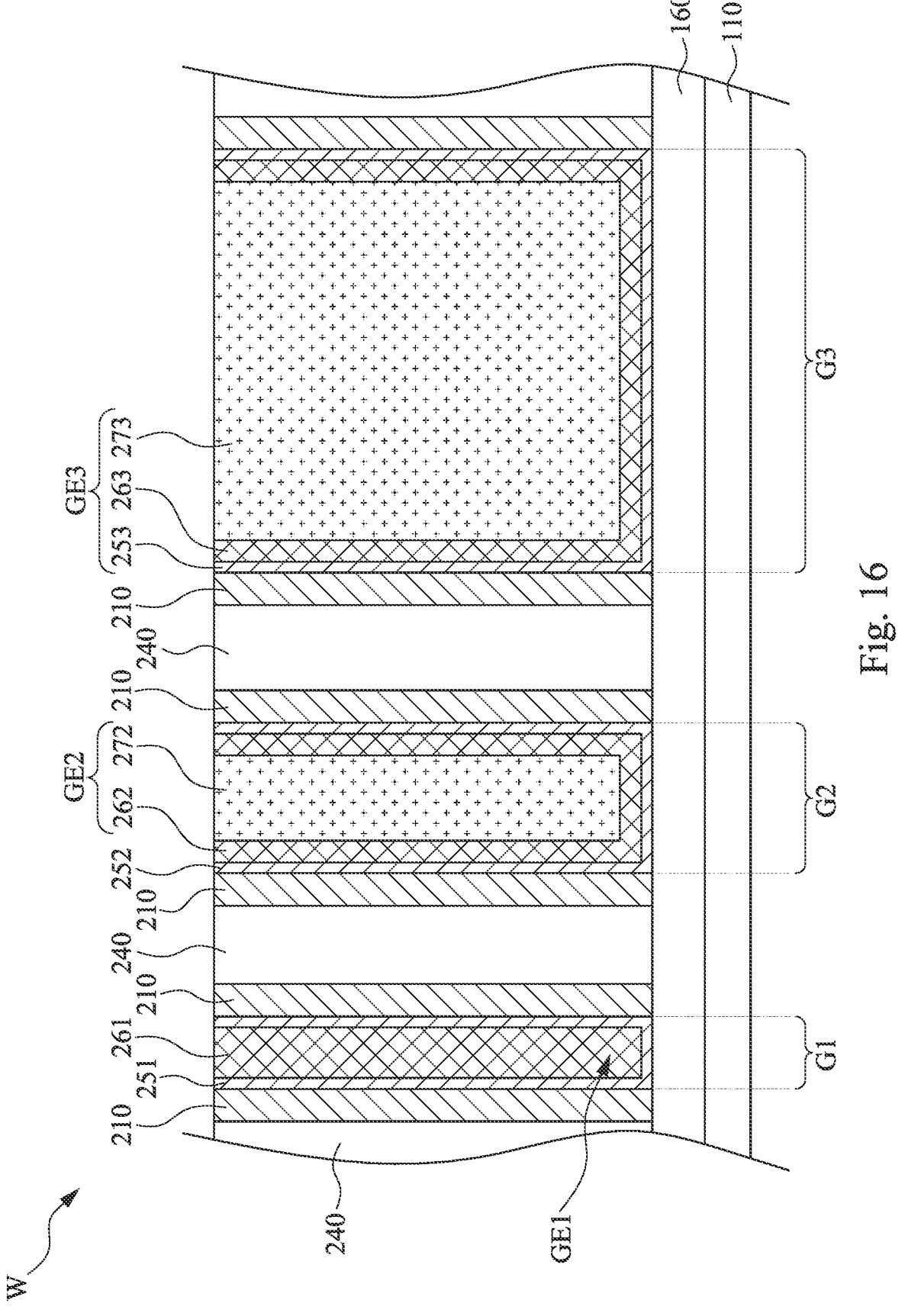
FIGS. 16-23 are cross-sectional views of a semiconductor device at various stages of the method in FIGS. 1A to 1B.

Reference is made to FIGS. 15 and 16, wherein FIG. 16 is a cross-sectional view of the wafer W taken along line 16-16 in FIG. 15. In some embodiments of block S23, first, second and third gate structures G1, G2 and G3 are respectively formed in the first, second and third gate trenches GT1, GT2 and GT3 (as shown in FIG. 14). Widths of the gate structures G1-G3 are associated with the corresponding gate trenches GT1-GT3, and hence the first gate structure G1 has a width less than a width of the second gate structure G2, and the width of the second gate structure G2 is less than a width of the third structure G3.

An exemplary method of forming these gate structures may include blanket forming a gate dielectric layer over the wafer W, forming one or more work function metal layers over the blanket gate dielectric layer, forming a fill metal layer over the one or more work function metal layers, and performing a CMP process to remove excessive materials of the fill metal layer, the one or more work function metal layers and the gate dielectric layer outside the gate trenches GT1, GT2 and GT3. As a result of this method, the first gate structure G1 includes a gate dielectric layer 251 and a work function metal layer 261 wrapped around by the gate dielectric layer 251, the second gate structure G2 includes a gate dielectric layer 252, a work function metal layer 262 wrapped around by the gate dielectric layer 252, and a fill metal 272 wrapped around by the work function metal layer 262, and the third gate structure G3 includes a gate dielectric layer 253, a work function metal layer 263 wrapped around by the gate dielectric layer 253, and a fill metal 273 wrapped around by the work function metal layer 263. The work function metal layer 261 of the first gate structure G1 may be equivalently referred to as a first gate electrode GE1, a combination of the work function metal layer 262 and the fill metal 272 of the second gate structure G2 may be equivalently referred to as a second gate electrode GE2, and a combination of the work function metal layer 263 and the fill metal 273 of the third gate structure G3 may be equivalently referred to as a third gate electrode GE3.

In some embodiments, the gate dielectric layers 251, 252 and/or 253 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layers 251, 252 and/or 253 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layers 251, 252 and/or 253 may have a multilayer structure such as one layer of silicon oxide (e.g., interfacial layer) and another layer of high-k material. In some embodiments, the gate dielectric layers 251, 252 and 253 are made of the same material because they are formed from the same dielectric layer blanket deposited over the substrate 110.

The work function metal layers 261, 262 and/or 263 include suitable work function metals to provide suitable work functions for the respective gate electrodes GE1, GE2 and GE3. In some embodiments, the work function metal layers 261, 262 and/or 263 may include one or more n-type work function metals (N-metal) for forming an n-type transistor on the substrate 110. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function metal layers 261, 262 and/or 263 may include one or more p-type work function metals (P-metal) for forming a p-type transistor on the substrate 110. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. At least two of the work function metal layers 261, 262 and 263 are made of different metals so as to provide suitable work functions to the corresponding gate electrodes.

The fill metals 272 and 273 respectively fill recesses in the work function metal layer 262 and 263. The fill metals 272 and/or 273 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. In some embodiments, the fill metals 272 and/or 273 are made of the same metal.

As illustrated in FIGS. 15 and 16, a difference between first and second gate structures G1 and G2 includes that the first gate structure G1 does not include a fill metal embedded in the work function metal layer 261 while the second gate structure includes a fill metal 272 embedded in the work function metal layer 262. This difference results from the width difference between the first and second gate structures G1 and G2. Moreover, a difference between the second gate structure G2 and the third gate structure G3 includes that the fill metal 273 in the third gate structure G3 has a width greater than a width of the fill metal 272 in the second gate structure G2. This difference results from the width difference between the second and third gate structures G2 and G3.

The geometry difference among the gate structures G1, G2 and G3, as discussed above, would result in pattern-dense regions and pattern-sparse regions over the substrate 110, which in turn will lead to a loading effect in a following metal back etch back (MGEB) process, which in turn will frustrate control of etch uniformity for the gate structures G1-G3 with different geometries. Embodiments of the present disclosure offer advantages, such as addressing the aforesaid issue regarding the MGEB loading effect, though it is understood that other embodiments may offer different advantages, not all advantages are necessarily discussed herein, and no particular advantage is required for all embodiments. By way of example, embodiments discussed herein additionally deposits a blanket sacrificial layer across the etched gate structures G1-G3, gate spacers 210 and the ILD layer 240 at an intermediate stage during the MGEB process, followed by continuing the MGEB process. Because the sacrificial layer is blanket formed over the wafer W at the intermediate stage during the MGEB process, the pattern-dense regions and pattern-sparse regions due to the gate structures with different geometries can be covered, which in turn will reduce the loading effect in a following stage of the MGEB process, as will be described further below.

Returning to FIG. 1B, blocks S24 to blocks S27 in the method M are directed to an MGEB process with the reduced loading effect according to some embodiments of the present disclosure. In some embodiments of block S24, with reference to FIG. 17, the MGEB process begins at performing one or more etching processes to the first, second and third gate structures G1, G2 and G3, thus resulting in first, second and third trenches T1, T2 and T3 over the etched gate structures G1-G3, respectively. Widths of the trenches T1-T3 are associated with widths of the respective gate structures G1-G3. Therefore, the first trench T1 has a width less than a width of the second trench T2, and the width of the trench T2 is less than a width of the third trench T3. For example, the width of the trench T1 is from about 6 nm to about 9 nm, the width of the trench T2 is from about 20 nm to about 72 nm, and the width of the trench T3 is from about 135 nm to about 240 nm. Moreover, depths of trenches T1-T3 are different due to the loading effect. For example, the depth of the first trench T1 is less than the depth of the second trench T2, and the depth of the second trench T2 is less than the depth of the third trench T3.

The one or more etching processes performed in the MGEB process are selective to materials of gate structures G1-G3 compared to gate spacers 210 and ILD layer 240, and hence etch rates of the gate structures G1-G3 are faster than etch rates of the gate spacers 210 and of ILD layer 240. Therefore, the one or more etching processes result in top surfaces of the gate dielectrics (e.g., gate dielectric layers 251', 252' and 253'), top surfaces of the work function metals (e.g., work function metal layers 261', 262' and 263') and top surfaces of the fill metals (e.g., fill metals 272' and 273') in lower positions than top surfaces of gate spacers 210 and of ILD layer 240. Moreover, the one or more etching processes are selective to gate dielectrics and work function metals compared to fill metals, and hence etch rates of either gate dielectrics or work function metals are faster than an etch rate of fill metals, which in turn will result in the fill metals 272' and 273' protruding from the respective work function metal layers 262' and 263'. Stated in another way, the top surfaces of the fill metals 272' and 273' are in positions higher than the top surfaces of the work function metal layers 262' and 263'.

The one or more etching processes used in the MGEB process includes dry etching, wet etching, atomic layer etching (ALE), plasma etching, other etching back techniques, or combinations thereof. In some embodiments, the one or more etching processes selective to gate dielectrics (e.g., gate dielectric layers 251, 252 and 253) and work function metals (e.g., work function metal layers 261, 262 and 263) is a plasma etching process employing one or more etchants such as a fluorine-containing gas (e.g., $CF_4$, $SF_6$, $CH_2F_2$, $CHF_3$, and/or $C_2F_6$) and/or a chlorine-containing gas (e.g., $Cl_2$, $CHCl_3$, $CCl_4$, and/or $BCl_3$).

Plasmas are partially ionized gas mixtures where a fraction of the atoms or molecules have lost an electron to produce positively charged ions. Electric and magnetic fields can be used to create plasmas and to control their behavior. Plasmas are generated through dissipation of the electrical power supplied to a gas mixture. The power is transferred to electrons and such energetic electrons then undergo collisions with atoms and molecules of the mixture to produce ions, more electrons and radicals by initiating processes such as ionization, excitation and dissociation. Electron impact can ionize an atom or molecule in the plasma or dissociate a molecule producing free radicals.

Free radicals may recombine with appropriate gas phase species to reproduce the state they originated from or create other species.

By way of example, the plasma etching process used in the MGEB process uses a gas mixture including an argon (Ar) gas, a boron trichloride ($BCl_3$) gas, a $Cl_2$ gas, and the like. Electron impact dissociation of $BCl_3$ produces $BCl_n$ radicals (n=1 or 2) and chlorine radicals to selectively etch the gate dielectrics and work function metals. Moreover, some chlorine redicals recombine with $BCl_n$ radicals to form $BCl_3$ gas. Further, the $BCl_n$ radicals may form $BCl_x$ compounds (x is a positive integer). Formation of the $BCl_x$ compounds is equivalently referred to as "polymerization." Conditions of the plasma etching process are tuned such that etching phenomenon is dominant over polymerization phenomenon in a plasma chamber. In some embodiments, the plasma is a cyclic process including repetitions of a first plasma etching step and a second plasma etching step. The cyclic process including repetitions of first and second plasma etching steps may be advantageous for mitigating the loading effect. In some embodiments, the first plasma etching step utilizes an etching pressure of about 4 mT to about 6 mT, a source power of about 800 W to about 1000 W, an RF bias power of about 20 W to about 40 W, a temperature of about 70° C. to about 90° C., a $BCl_3$ gas flow of about 150 sccm to about 250 sccm, and a $Cl_2$ gas flow of about 150 sccm to about 250 sccm. In some embodiments, the second plasma etching step utilizes an etching pressure of about 1.7 mT to about 2.1 mT, a source power of about 400 W to about 600 W, zero RF bias power, a temperature of about 70° C. to about 90° C., a $Cl_2$ gas flow of about 110 sccm to about 120 sccm, and a $O_2$ gas flow of about 5 sccm to about 9 sccm. If process conditions in the plasma etching are out of the above ranges, heights of the resulting gate structures G1-G3 might be unsatisfactory.

In some embodiments where $HfO_2$ is used as the gate dielectrics, an example etching mechanism of the $HfO_2$ in $Ar/BCl_3/Cl_2$ plasmas is described as follows. For example, Hf—O bond breaking is the first step followed by Cl adsorption by Hf atoms that produces solid $HfCl_x$ and $BCl_x$ adsorption by bond cleaved O that generated solid $B_mOCl_n$. Later $HfCl_x$ and $B_mOCl_n$ solids are etched as volatile $HfCl_x$ (x=2-4), $BOCl$, $B_2OCl_3$ and $B_2OCl_4$ by ion impact reactions. In some embodiments where TiN is used as work function metals, an example etching mechanism of TiN in $Ar/BCl_3/Cl_2$ plasmas is described as follows. For example, TiN etching begins with ion bombardment to break Ti—N bonds and liberate N atoms. The Ti site then absorbs Cl leading to formation of $TiCl_n$ (n=1-3) on a surface of the TiN layer. Ion bombardment removes these compounds as $TiCl_n$ gas. TiN surface can itself absorb Cl to produce TiNCl on the surface of TiN layer, followed by energetic ion bombardment containing Cl to remove Ti from TiNCl as volatile $TiCl_n$ gas.

Figure 18:
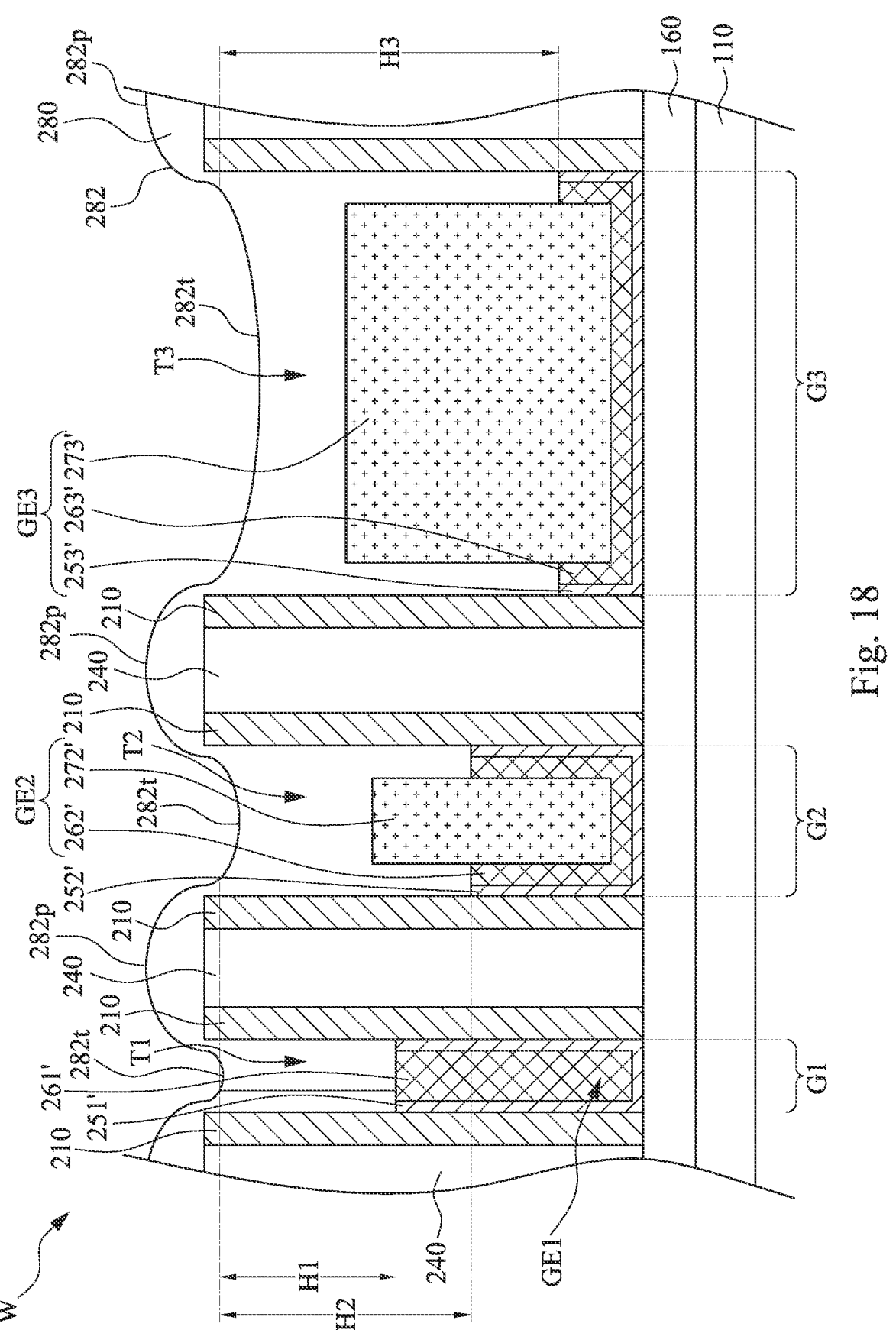

Returning to FIG. 1B, the method M then proceeds to block S25 where a sacrificial layer is blanket formed over the substrate. With reference to FIG. 18, in some embodiments of block S25, a blanket sacrificial layer 280 is formed in the trenches T1-T3 and across the gate structures G1-G3, the gate spacers 210 and the ILD layer 240. As a result, pattern-dense regions and pattern-sparse regions due to the gate structures G1-G3 with different geometries can be covered by the sacrificial layer 280, which in turn will reduce the loading effect in a following stage of the MGEB process.

In some embodiments, formation of the sacrificial layer 280 includes performing a plasma treatment to the wafer W using a gas mixture of a chlorine-containing gas, a hydrogen ($H_2$) gas and an Ar gas. In some embodiments where the chlorine-containing gas is $BCl_3$ gas, the plasma treatment results in dissociation of $BCl_3$, which in turn will produce $BCl_n$ radicals and chlorine radicals, as discussed above. Moreover, the plasma treatment also results in dissociation of the $H_2$ gas, which in turn will produce hydrogen radicals. The hydrogen radicals react with chlorine radicals to produce a hydrochloric acid (HCl) gas. In this way, the chlorine radicals dissociated from the $BCl_3$ gas is consumed by the hydrogen radicals dissociated from the $H_2$ gas. Therefore, recombination of the chlorine radicals with $BCl_n$ radicals dissociated from the $BCl_3$ gas will be reduced, which in turn will increase $BCl_n$ radicals in the plasma chamber. Because $BCl_n$ radicals can form $BCl_x$ compounds, the increased $BCl_n$ radicals will result in increasing of $BCl_x$ compounds. As a result, in this plasma treatment using the $BCl_3$ gas and the $H_2$ gas, polymerization phenomenon can be dominant over etching phenomenon, which in turn will result in deposition of a $BCl_x$ compound layer blanket over the wafer W. The $BCl_x$ compound layer can serve as the sacrificial layer 280 which will be removed in following stages of the MGEB process. In some embodiments, the flow rate of the $H_2$ gas ranges from about 30 sccm to about 130 sccm. If the flow rate of the $H_2$ gas is lower than 30 sccm, the amount of the $BCl_x$ compound deposition will be insufficient. If the flow rate of the $H_2$ gas is higher than 130 sccm, the $BCl_x$ compound will be too thick to achieve uniform deposition. In some embodiments, the plasma treatment utilizes an etching pressure of about 10 mT to about 20 mT, an source power of about 400 W to about 600 W, an RF bias power of about 5 W to about 15 W, a temperature of about 100° C. to about 120° C., a $BCl_3$ gas flow of about 150 sccm to about 250 sccm, a $H_2$ gas flow of about 60 sccm to about 80 sccm, and an argon gas flow of about 190 sccm to about 210 sccm. If the process conditions of the plasma treatment are out of the above ranges, the thickness and uniformity of the resulting sacrificial layer 280 might be unsatisfactory.

As discussed above, in some embodiments, etching back the gate structures G1-G3 in block S24 and formation of the sacrificial layer 280 in block S25 both employ plasmas using the $BCl_3$ gas, but a difference between blocks S24 and S25 includes that the plasma treatment in block S25 involve an $H_2$ gas and the plasma etching process in block S24 does not involve the $H_2$ gas. Stated differently, the plasma treatment is performed in a hydrogen-containing environment, and the plasma etching process is performed in a hydrogen-free environment. In this way, the gases used in the plasma process in block S24 can etch back the gate structures G1-G3, and the gases used in the plasma process in block S25, which is different from the gases used in block S24, can form a $BCl_x$ compound layer 280 across the gate structures G1-G3, the gate spacers 210 and the ILD layer 240. Moreover, etching back the gate structures G1-G3 and blanket forming the $BCl_x$ compound layer 280 are performed using plasmas, and hence the etching back the gate structures G1-G3 and blanket forming the $BCl_x$ compound layer 280 may be performed in-situ, which in turn will prevent contamination of the gate structures G1-G3.

As used herein, the term "in-situ" is used to describe processes that are performed while a device or substrate remains within a processing system (e.g., including a load lock chamber, transfer chamber, processing chamber, or any other fluidly coupled chamber), and where for example, the processing system allows the substrate to remain under vacuum conditions. As such, the term "in-situ" may also generally be used to refer to processes in which the device or substrate being processed is not exposed to an external environment (e.g., external to the processing system).

By way of example, the etching back the gate structures G1-G3 and blanket forming the $BCl_x$ compound layer 280 can be performed in the same plasma chamber. During etching back the gate structures G1-G3, if the plasma chamber is introduced with the $BCl_3$ gas, it is not introduced with the $H_2$ gas, so as to inhibit polymerization during the etching back. During forming the $BCl_x$ compound layer 280, the plasma chamber is introduced a gas mixture of the $BCl_3$ gas and the $H_2$ gas, so as to improve the polymerization for forming the $BCl_x$ compound layer 280.

In some embodiments, the formation of the sacrificial layer 280 is a cyclic process including at least one repetition of a deposition step and a thin-down step, which will result in improved surface flatness of the sacrificial layer. For example, it may perform a deposition step followed by a thin-down step, and repeats the deposition and thin-down steps. During the deposition steps, the wafer W undergoes the plasma treatment using a gas mixture of the $BCl_3$ gas, the $H_2$ gas and the Ar gas. During the thin-down step, the wafer W undergoes a plasma treatment using the Ar gas without using the $BCl_3$ gas and $H_2$ gas. In this way, argon ions produced from the Ar gas in the plasma treatment can bombard the sacrificial layer 280 formed in the previous deposition step, and absence of the $BCl_3$ gas and $H_2$ gas can inhibit depositing more $BCl_x$ compounds on the sacrificial layer 280. In other words, the deposition step is performed in a hydrogen-containing environment, and the thin-down step is performed in a hydrogen-free environment. The cyclic process may be advantageous for forming the sacrificial layer 280 with desired profile and uniformity. More repetitions of the deposition step and the thin-down step forms thicker sacrificial layer 280 compared to that formed by less repetitions of the deposition step and the thin-down step. For example, five repetitions of the deposition step and thin-down step forms a thicker $BCl_x$ compound layer than that formed by two repetitions of the deposition and thin-down step.

Because the deposition step and the thin-down step are achieved using plasma treatments, they can be performed in-situ, which in turn will prevent contamination of the gate structures G1-G3. By way of example, the deposition step and the thin-down step can be performed in the same plasma chamber. During the deposition step, the plasma chamber is introduced with a gas mixture of the $BCl_3$ gas, the $H_2$ gas and the Ar gas to deposit $BCl_x$ compounds. During the thin-down step, the introducing of at least one of the $BCl_3$ gas and the $H_2$ gas into the plasma chamber is stopped or halted, so as to inhibit polymerization. Moreover, during the thin-down step, introducing of the Ar gas into the plasma chamber is continued so as to thin down the deposited $BCl_x$ compounds using bombardment of argon ions.

As a result of the cyclic process, in some embodiments, a distance H1 from a top end of the work function metal layer 261' to a top surface 282 of the sacrificial layer 280 is shorter than a distance H2 from a top end of the work function metal layer 262' to the top surface 282 of the sacrificial layer 280, and the distance H2 from the top end of the work function metal layer 262' to the top surface 282 of the sacrificial layer 280 is shorter than a distance H3 from the top end of the work function metal layer 263' to the top surface 282 of the sacrificial layer 280. As a result, the sacrificial layer 280 can forms a smoother topography compared to the etched gate structures G1-G3, which in turn may be advantageous for reducing the loading effect.

In some embodiments, the cyclic process forms the sacrificial layer 280 with a wavy top surface 282 including alternating peaks 282p and troughs 282t. The peaks 282p are over the ILD layer 240, and the troughs 282t are over the respective gate electrodes GE1, GE2 and GE3. As illustrated, the height difference between peaks 282p and troughs 282t is less than the height difference between a top surface of the ILD layer 240 and top surfaces of the etched gate structures G1-G3. Therefore, the sacrificial layer 280 can provide a smoother topography compared to the etched gate structures G1-G3. Moreover, as illustrated, width difference among the trenches T1-T3 results in width difference among portions of the sacrificial layer 280 in the trenches T1-T3. For example, a portion of the sacrificial layer 280 in the first trench T1 has a width less than a width of a portion of the sacrificial layer 280 in the second trench T2, and the width of the portion of the sacrificial layer 280 in the second trench T2 is less than a width of a portion of the sacrificial layer 280 in the third trench T3.

Figure 17:
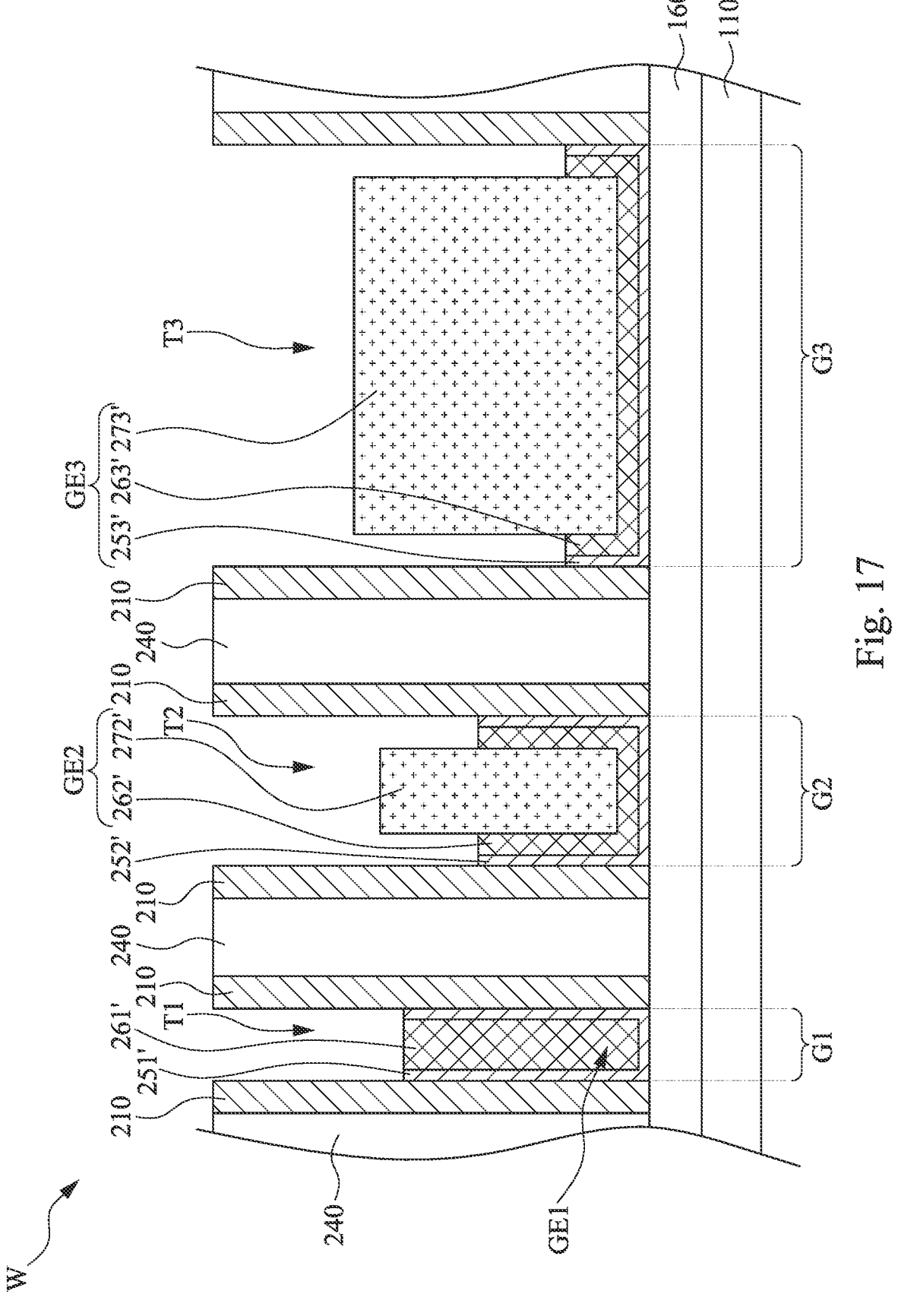
Figure 19:
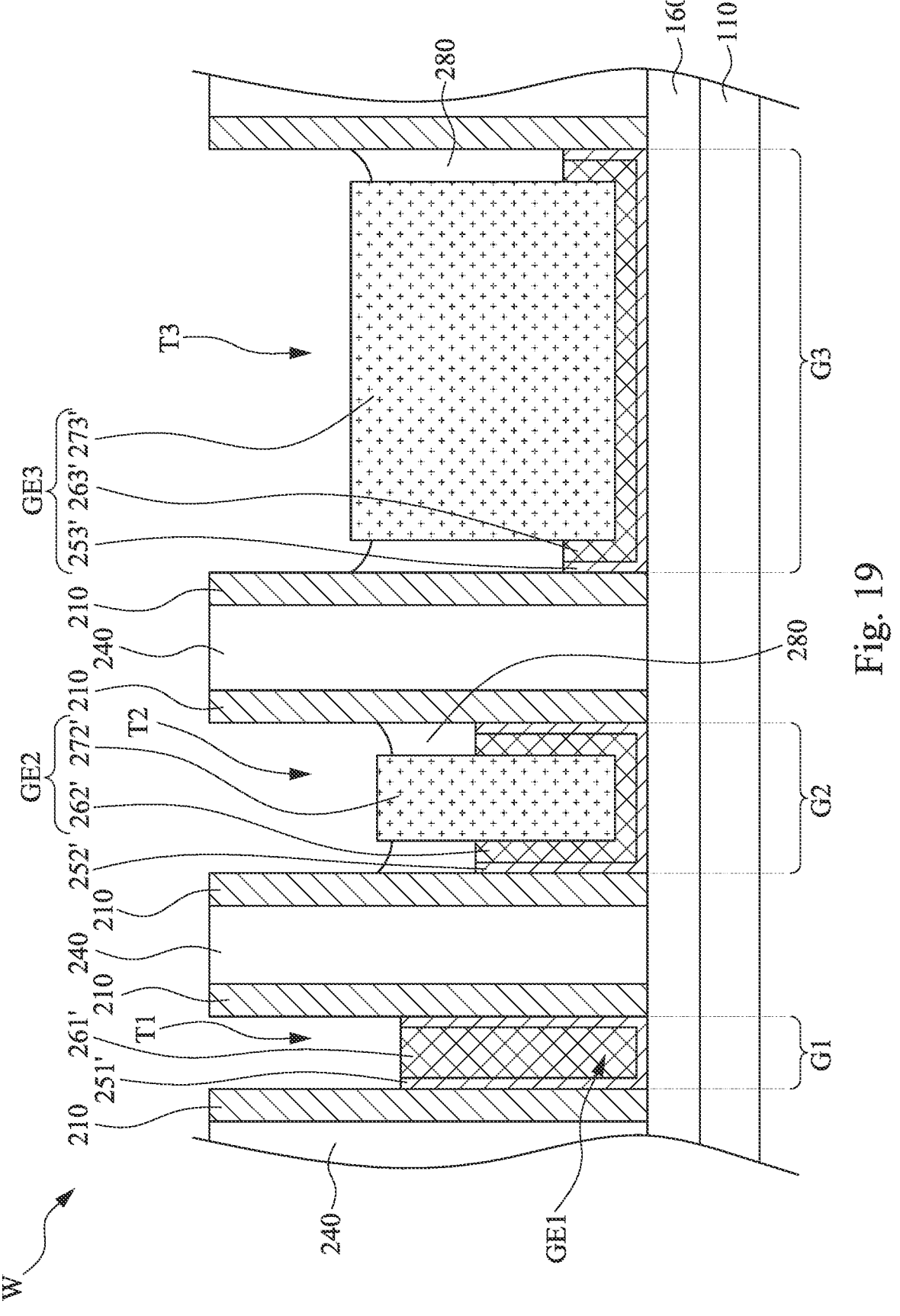
Figure 20:
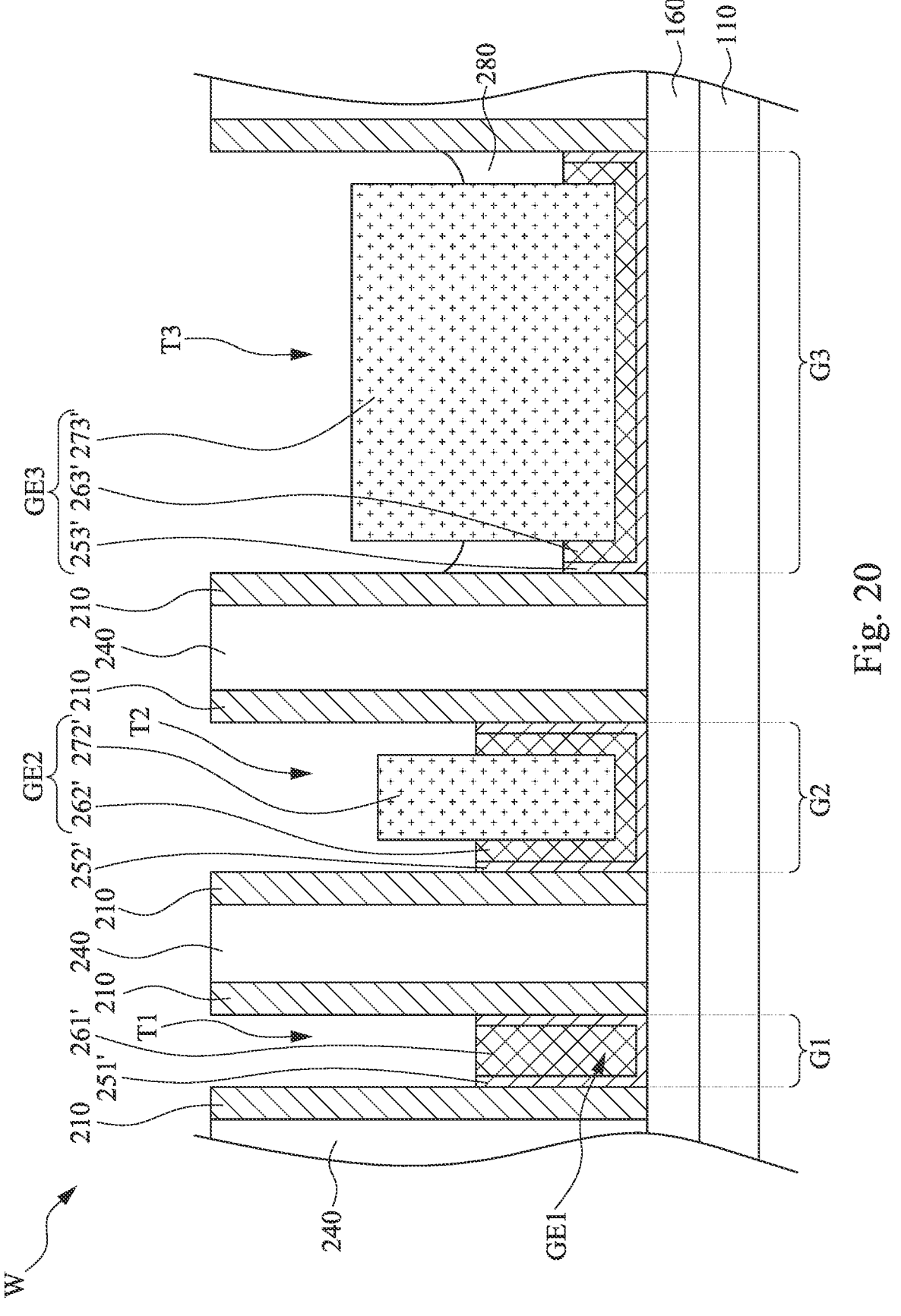
Figure 21:
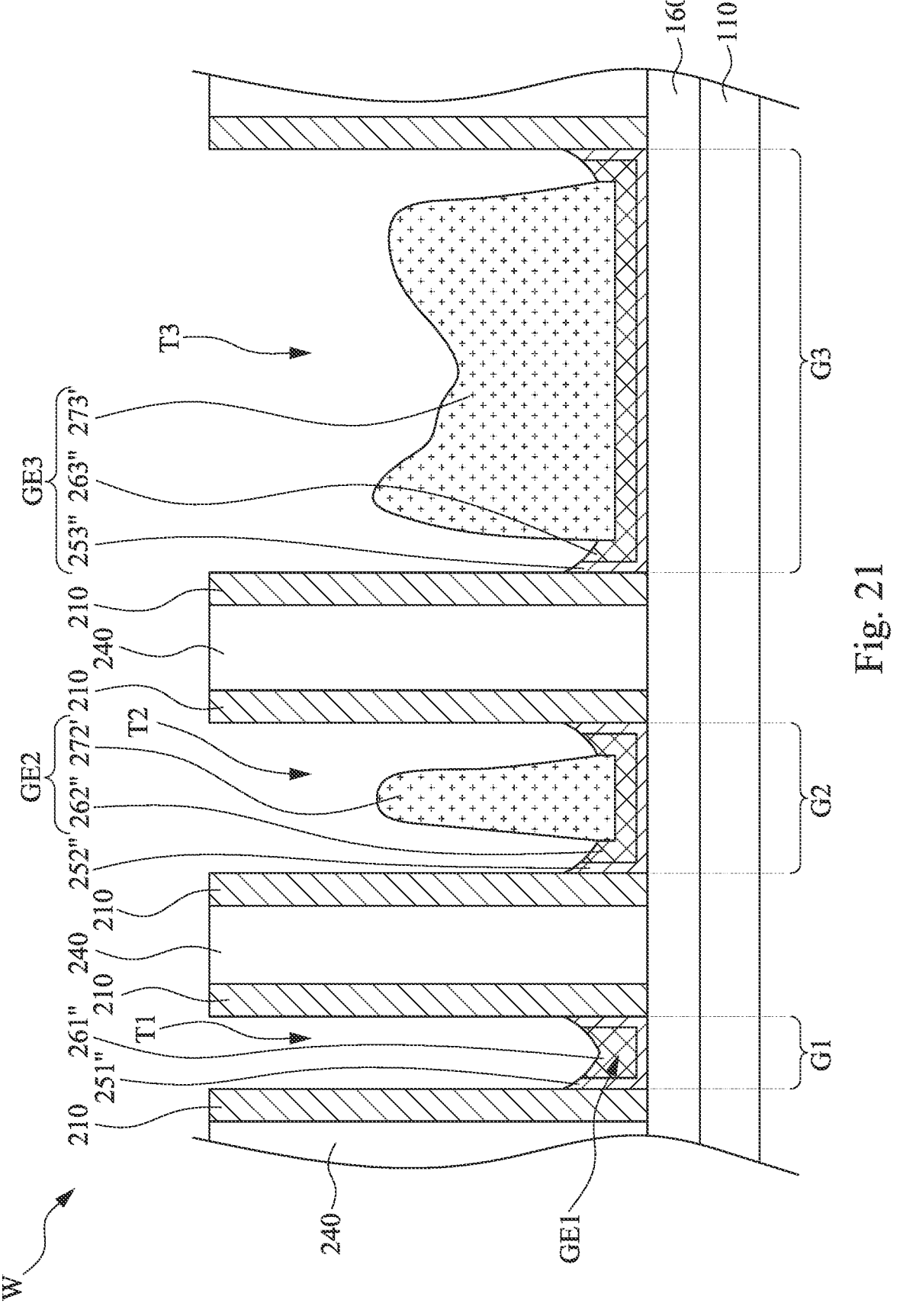

Returning to FIG. 1B, the method M then proceeds to block S26 where the sacrificial layer and the underlying work function metals and gate dielectrics are etched. FIGS. 19-21 illustrate sequential stages of some embodiments of block S26. In some embodiments, one or more etching processes are performed to the sacrificial layer 280 and the underlying work function metals (e.g. work function metal layers 261', 262' and 263') and gate dielectrics (e.g., gate dielectric layers 251', 252' and 253'), so as to deepen the trenches T1-T3. As illustrated in FIGS. 18 to 21, the one or more etching processes begins from the sacrificial layer 280 that covers the gate structures G1-G3, the gate spacers 210 and the ILD layer 240. In this way, the height difference among the resulting work function metal layers 261"-263" as shown in FIG. 21 is reduced compared to the height difference among the work function metal layers 261'-263' as shown in FIG. 17. Therefore, the loading effect of etching back the work function metals is reduced. Moreover, the height difference among the resulting gate dielectric layers 251"-253" as shown in FIG. 21 is also reduced compared to the height difference among the work function metal layers 251'-253' as shown in FIG. 17. In some embodiments, formation of the sacrificial layer 280 performed in FIG. 18 and the one or more metal etching processes performed in FIGS. 19-21 may be performed one or more times until desired height difference among the work function metal layers are achieved.

In some embodiments, the one or more etching processes used in block S26 include dry etching, wet etching, atomic layer etching (ALE), plasma etching, other etching back techniques, or combinations thereof. In some embodiments, the one or more etching processes used in block S26 is a plasma etching process employing one or more etchants such as a fluorine-containing gas (e.g., $CF_4$, $SF_6$, $CH_2F_2$, $CHF_3$, and/or $C_2F_6$) and/or a chlorine-containing gas (e.g., $Cl_2$, $CHCl_3$, $CCl_4$, and/or $BCl_3$). In some embodiments, the plasma etching process may use the same chemistry as used in the etching back process in block S24. By way of example, the plasma etching process uses a gas mixture including an Ar gas, a $BCl_3$ gas, and $Cl_2$ gas, as discussed above. In some embodiments where the plasma etching process in block S26 uses the $BCl_3$ gas, the $H_2$ gas is absent from the plasma etching process, so as to inhibit polymerization.

As discussed above, in some embodiments, formation of the sacrificial layer 280 in block S25 and etching the sacrificial layer 280 and underlying materials in block S26 employ plasmas using the $BCl_3$ gas, and hence they can be performed in-situ, which in turn will prevent contamination of the gate structures G1-G3. By way of example, the formation of the sacrificial layer 280 and the etching the sacrificial layer 280 and underlying materials can be performed in the same plasma process chamber. During forming the $BCl_x$ compound layer 280, the plasma chamber is introduced with $BCl_3$ gas and the $H_2$ gas, so as to improve the polymerization for forming the $BCl_x$ compound layer 280. During etching sacrificial layer 280 and underlying materials, the introducing of the $H_2$ gas into the plasma chamber is stopped or halted, so as to inhibit polymerization during the etching process.

Figure 22:
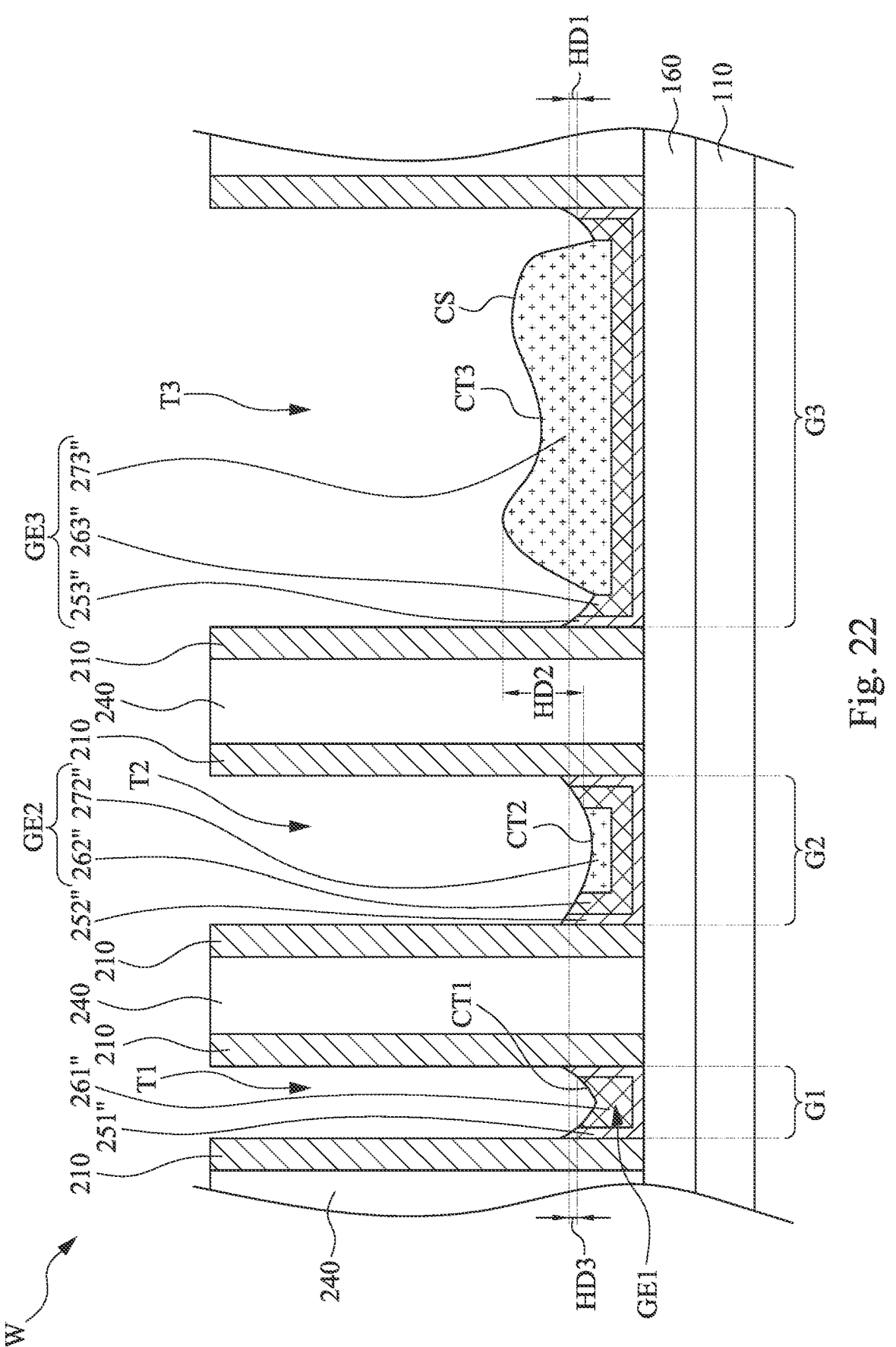

The method M then proceeds to block S27 where fill metals are etched back. With reference to FIG. 22, in some embodiments of block S27, a selective etch back process is performed to etch fill metals, thereby resulting in lowered (or thinned down) fill metals 272" and 273". As a result of a series of operations from block S24 to block S27, the resulting fill metal 273" has a concave top surface CT3 in some embodiments. Moreover, in some embodiments, the fill metal 273" has a convex portion CS around the concave top surface CT3. It is understood that the fill metal would not have a concave top surface and/or a convex portion if the operation in block S25 (i.e. formation of the sacrificial layer) is omitted. In some embodiments, the fill metal 272" has a concave top surface CT2, and the concave top surface CT2 of the fill metal 272" is narrower than the concave top surface CT3 of the fill metal 273", because the fill metal 272" is formed in the trench T2 narrower than the trench T3 in which the fill metal 273" is formed. In some embodiments, the work function metal layer 261" has a concave top surface CT1 narrower than the concave top surface CT2 of the fill metal 272", because the work function metal layer 261" is formed in the trench T1 narrower than the trench T2 in which the fill metal 272" is formed. Moreover, a height difference HD1 between top ends of work function metal layers 262" and 263" is less than a height difference HD2 between top ends of the fill metals 272" and 273", and a height difference HD3 between top ends of work function metal layers 261" and 262" is less than the height difference HD2 between top ends of the fill metals 272" and 273" as well. Therefore, it's clear that the height difference among the resulting work function metal layers 261", 262" and 263" are reduced in the semiconductor device formed using the sacrificial layer 280 (See FIG. 18), as compared to the semiconductor device formed without using the sacrificial layer 280.

In some embodiments, the etch back process uses an etchant that is selective to fill metals compared to other materials (e.g., work function metals) on the substrate 110. Therefore, the etchant is different from that used in the etch back process in blocks S24 and S26. In some embodiments where the fill metals are tungsten, the etchant includes a fluorine-based gas (e.g., $NF_3$) or a gas mixture of the $Cl_2$ gas and the $O_2$ gas, which etches more fill metals than work function metals.

Figure 23:
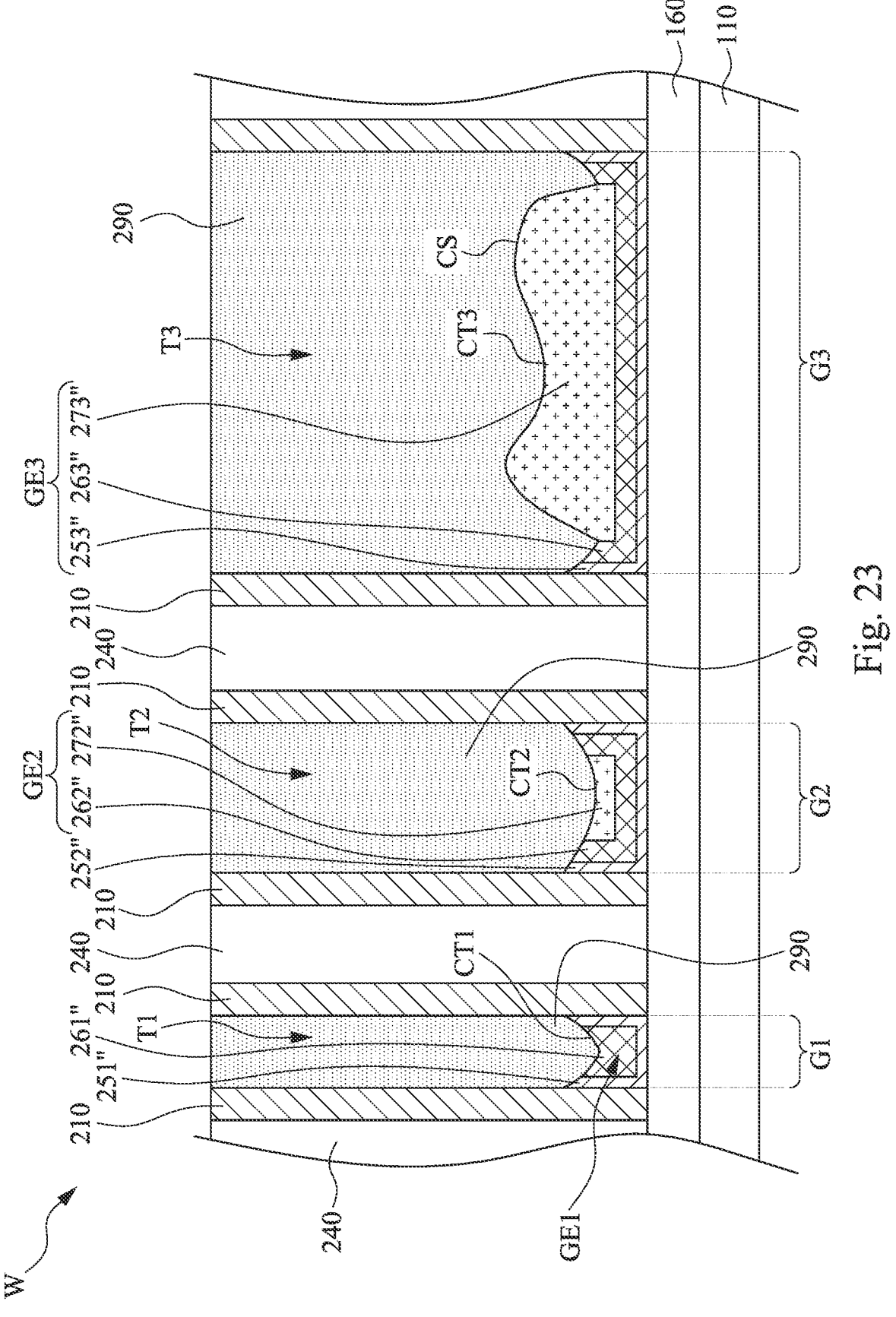

Returning to FIG. 1B, the method M then proceeds to block S28 where a dielectric cap layer is formed over the etched back gate structures. With reference to FIG. 23, in some embodiments of block S28, a dielectric cap layer 290 is formed to cap the etched back gate structures G1, G2 and G3. Formation of the dielectric cap layer 290 includes, for example, forming a dielectric layer on the wafer W followed by planarizing the dielectric layer to remove excess materials outside the trenches T1-T3. The dielectric cap layer 290 is silicon nitride, silicon oxynitride, the like, or combinations thereof.

Figure 24:
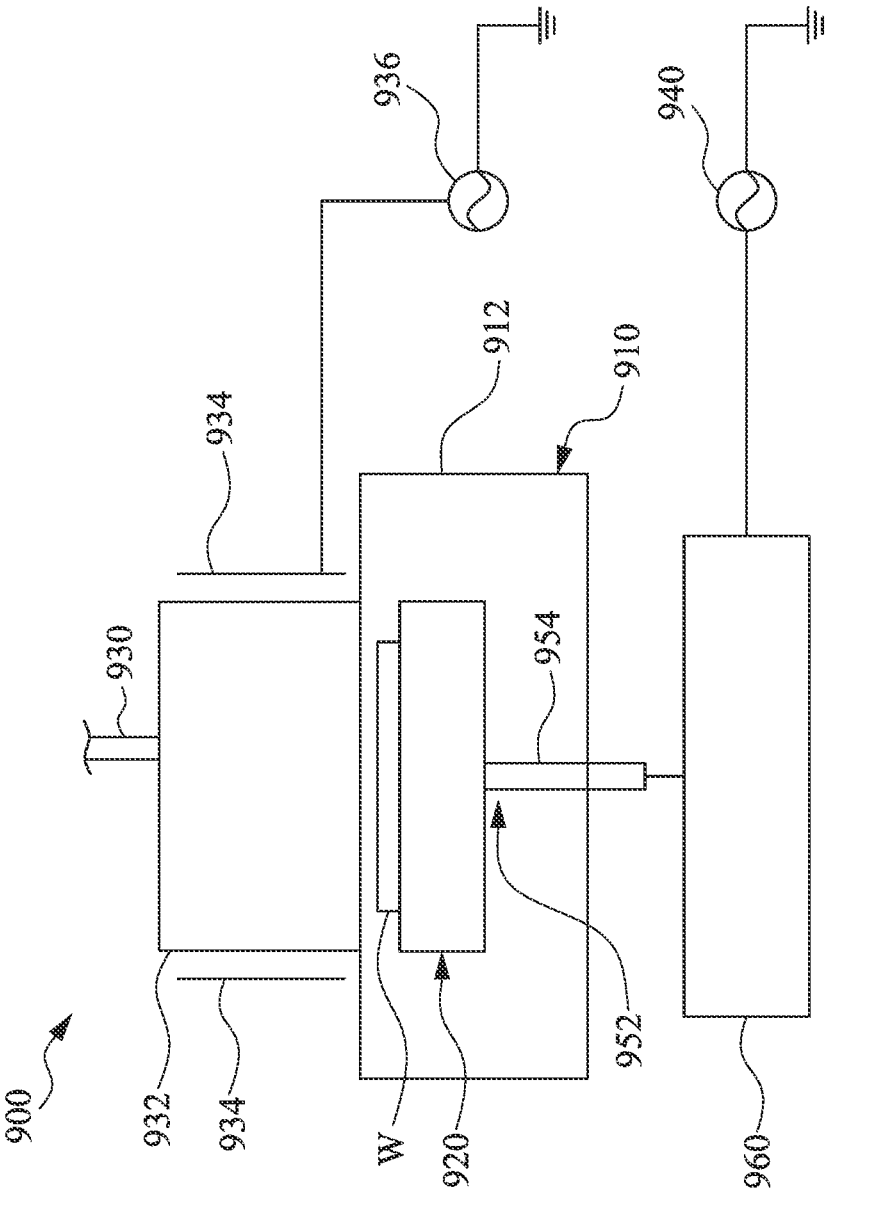
FIG. 24 is a cross-sectional view of a plasma chamber in accordance with some embodiments of the present disclosure.

Referring now to FIG. 24, illustrated is a cross-sectional view of an exemplary plasma chamber 900 in some embodiments of the present disclosure. As shown in FIG. 24, the plasma chamber 900 includes a chamber base 910 having a grounded chamber wall 912. The chamber base 910 is closed by a removable lid or a cover 932 and contains a pedestal assembly 920 which can be raised and lowered on a shaft 954 by actuation of a pedestal lift assembly 952. An inductively-coupled plasma coil 934 surrounds the lid 932 and is connected to an RF source power supply 936. The pedestal assembly 920 is connected, through an RF match network 960 which matches impedances, to an RF power supply 940. During operation of the plasma chamber 900, the pedestal assembly 920 supports the wafer W in the chamber base 910. One or more gases are supplied from a gas inlet 930 into the plasma chamber 900. Volatile reaction products and unreacted plasma species are removed from the plasma chamber 900 by a gas removal mechanism (not shown). Source power such as a high voltage signal, provided by the RF source power supply 936, is applied to the inductively-coupled plasma coil 934 to ignite and sustain a plasma in the plasma chamber 900. Ignition of a plasma in the plasma chamber 900 is accomplished primarily by electrostatic coupling of the inductively-coupled plasma coil 934 with the source gas, due to the large-magnitude voltage applied to the inductively-coupled plasma coil 934 and the resulting electric fields produced in the plasma chamber 900. Once ignited, the plasma is sustained by electromagnetic induction effects associated with time-varying magnetic fields produced by the alternating currents applied to the inductively-coupled plasma coil 934. Through the RF power supply 940, the pedestal assembly 920 is electrically biased to provide to the wafer W ion energies that are independent of the RF voltage applied to the chamber 900 through the inductively-coupled plasma coil 934 and RF source power supply 936. This facilitates more precise control over the energies of the ions that bombard the surface of the wafer W.

As discussed above, in some embodiments, the etch back process in block S24 and the formation of the sacrificial layer in block S25 can be performed in the same plasma chamber 900 (i.e. in-situ). Moreover, in some embodiments where the gas inlet 930 introduces a $BCl_3$ gas into the plasma chamber 900 during the etch back process in block S24, the gas inlet 930 does not introduce an $H_2$ gas into the plasma chamber 900 to inhibit polymerization. On the contrary, the gas inlet 930 introduces at least the $BCl_3$ gas and $H_2$ gas into the plasma chamber 900 during the formation of the sacrificial layer in block S25.

As discussed above, in some embodiments where block S25 includes repetitions of a deposition step and a thin-down step, the deposition step and the thin-down step can be performed in the same plasma chamber 900 (i.e. in-situ). Moreover, the gas inlet 930 introduces a gas mixture of a $BCl_3$ gas, an $H_2$ gas and an Ar gas into the plasma chamber 900 during the deposition step, and stops introducing at least one of the $BCl_3$ gas and the $H_2$ gas into the plasma chamber 900 during the thin-down step. The stopping of introducing at least one of the $BCl_3$ gas and the $H_2$ gas can be controlled by a valve (not shown) that connects between the gas inlet 930 and a gas source of the at least one of the $BCl_3$ gas and the $H_2$ gas.

As discussed above, in some embodiments, the formation of the sacrificial layer in block S25 and the etch back process in block S26 can be performed in the same plasma chamber 900 (i.e. in-situ). Moreover, in some embodiments where the gas inlet 930 introduces a $BCl_3$ gas into the plasma chamber

900 during the etch back process in block S26, the gas inlet 930 does not introduce an $H_2$ gas into the plasma chamber 900.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the loading effect of the MGEB process can be reduced by using forming an additional sacrificial layer across the wafer at an intermediate stage of the MGEB process. By way of example, when a short channel device (e.g. a device including the gate structure G1) and a middle channel device (e.g. a device including the gate structure G2 wider than the gate structure G1) are fabricated without using the sacrificial layer, a height difference between top ends of work function metals of the short and middle channel devices may be in a range from about 22.1 nm to about 22.5 nm. On the contrary, when a short channel device and a middle channel device are fabricated using the sacrificial layer during the MGEB process, a height difference between top ends of work function metals of the short and middle channel devices may be in a range from about 6.7 nm to about 7.1 nm, which means the loading effect of the MGEB process to the short and middle channel devices is reduced. Moreover, when a short channel device and a long channel device (e.g. a device including the gate structure G3 wider than the gate structure G2) are fabricated without using the sacrificial layer, a height difference between top ends of work function metals of the short and long channel devices may be in a range from about 30.6 nm to about 31 nm. On the contrary, when a short channel device and a long channel device are fabricated using the sacrificial layer during the MGEB process, a height difference between top ends of work function metals of the short and long channel devices may be in a range from about 3.1 nm to about 3.5 nm, which means the loading effect of the MGEB process to the short and long channel devices is reduced as well.

Further, compared with reducing the MGEB loading effect using an additional photolithography process, another advantage offered by embodiments of the present disclosure is that height loss of ILD layer and gate spacers can be reduced because the additional photolithography process includes a hard mask removal operation which would considerably lower the ILD layer and gate spacers. Yet another advantage is that formation of the sacrificial layer can be in-situ performed with the MGEB process, which in turn will reduce contamination of the wafer.

In some embodiments, a semiconductor device includes first and second gate structures disposed over a substrate, the first gate structure has a first width that is smaller than a second width of the second gate structure, wherein a lower portion of the first gate structure having a first work-function material (WFM) layer, the first WFM layer having a top surface, a lower portion of the second gate structure having a second WFM layer, the second WFM layer having a top surface; and a first gate electrode disposed over the first WFM layer and a second gate electrode having a lower portion disposed in the second WFM layer, wherein the first gate electrode has a first width that is smaller than a second width of the second gate electrode, and wherein the top surface of the second WFM layer is at a level below a top surface of the second gate electrode.

In some embodiments, a semiconductor device includes a substrate; a first gate structure over the substrate, the first gate structure comprising a first gate dielectric layer; a first work-function material (WFM) layer; and a first gate metal; a second gate structure over the substrate, the second gate structure being wider than the first gate structure, the first gate structure comprising a second gate dielectric layer; a second WFM layer; and a second gate metal; a first dielectric cap layer over the first gate structure and in contact with the first gate dielectric layer; and a second dielectric cap layer over the second gate structure and in contact with the second gate dielectric layer.

In some embodiments, a semiconductor device includes a first gate structure over the substrate, the first gate structure comprising a first gate dielectric layer; a first work-function material (WFM) layer; and a first gate electrode; a second gate structure over the substrate, the second gate structure being wider than the first gate structure, the first gate structure comprising a second gate dielectric layer; a second WFM layer; and a second gate electrode, wherein the first gate electrode has a first height shorter than a second height of the second gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first gate structure and a second gate structure over a substrate, the second gate structure being wider than the first gate structure;
   etching back the first gate structure and the second gate structure;
   performing a deposition process to form a sacrificial layer spanning over the first gate structure and the second gate structure, wherein the deposition process comprises employing a chlorine-containing gas in a hydrogen-containing environment;
   performing an etching back process to the sacrificial layer to expose top surfaces of the first gate structure and the second gate structure, while leaving remaining portions of the sacrificial layer on sidewalls of the first gate structure and the second gate structure; and
   performing an etching process to etch the sacrificial layer, the first gate structure, and the second gate structure, wherein the etching process comprises employing the chlorine-containing gas in a hydrogen-free environment.

2. The method of claim 1, wherein the etching back is also performed in a hydrogen-free environment.

3. The method of claim 1, wherein the remaining portions of the sacrificial layer are in contact with sidewalls of gate metals of the first and second gate structures.

4. The method of claim 1, wherein the etching back process is performed such that a top end of a first work function metal layer of the first gate structure is lower than a top end of a second work function metal layer of the second gate structure.

5. The method of claim 1, further comprising removing the sacrificial layer from the first and second gate structures after performing the etching process.

6. The method of claim 5, further comprising thinning down the first and second gate structures after removing the sacrificial layer.

7. The method of claim 6, further comprising forming a dielectric cap layer covering the first and second gate structures after thinning down the first and second gate structures.

8. A method, comprising:

forming a first gate structure and a second gate structure over a substrate, the second gate structure being wider than the first gate structure, wherein each of the first gate structure and the second gate structure comprises a gate dielectric layer, a work function metal layer over the gate dielectric layer, and a filling metal over the work function metal layer;

etching back the first gate structure and the second gate structure;

performing a deposition process to form a sacrificial layer over the first gate structure and the second gate structure, wherein the sacrificial layer interfaces a top end of the gate dielectric layer of each of the first gate structure and the second gate structure, wherein the deposition process comprises employing a chlorine-containing gas in a hydrogen-containing environment, and wherein the deposition process comprises a plurality of deposition cycles, wherein each of the deposition cycle comprises:

performing a first plasma treatment to form a material of the sacrificial layer; and performing a second plasma treatment to thin down the material of the sacrificial layer; and performing an etching process to etch the sacrificial layer, the first gate structure, and the second gate structure, wherein the etching process comprises employing the chlorine-containing gas in a hydrogen-free environment.

9. The method of claim 8, wherein etching back the first gate structure and the second gate structure is performed such that the top end of the gate dielectric layer and a top end of the work function metal layer are lower than a top end of the gate metal.

10. The method of claim 8, wherein the material of the sacrificial layer comprises $BCl_x$ compound.

11. The method of claim 8, wherein the first plasma treatment is performed using $BCl_3$ gas, $H_2$ gas, and Ar gas, while the second plasma treatment is performed using Ar gas without using $BCl_3$ gas and $H_2$ gas.

12. The method of claim 8, wherein the first plasma treatment is performed in a hydrogen-containing environment, while the second plasma treatment is performed in a hydrogen-free environment.

13. The method of claim 8, wherein the first plasma treatment and the second plasma treatment are performed in-situ.

14. The method of claim 8, wherein etching back the first gate structure and the second gate structure and the deposition process are performed in-situ.

15. A method, comprising:

forming a first gate structure and a second gate structure over a substrate, the second gate structure being wider than the first gate structure, wherein each of the first gate structure and the second gate structure comprises a filling metal and a work function metal layer lining the filling metal;

etching back the first gate structure and the second gate structure;

performing a deposition process to form a sacrificial layer over the first gate structure and the second gate structure, wherein the deposition process comprises employing a chlorine-containing gas in a hydrogen-containing environment, and wherein etching back the first gate structure and the second gate structure and the deposition are performed in a same chamber; and performing an etching process to etch the sacrificial layer, the first gate structure, and the second gate structure, wherein the etching process comprises employing the chlorine-containing gas in a hydrogen-free environment, and wherein after the etching process is complete, a top surface of the filling metal of the second gate structure comprises a convex portion.

16. The method of claim 15, wherein performing the etching process is also performed in the same chamber.

17. The method of claim 15, wherein etching back the first gate structure and the second gate structure is performed without using hydrogen gas.

18. The method of claim 17, wherein the chlorine-containing gas comprises $BCl_3$.

19. The method of claim 15, wherein the deposition process comprises a plurality of deposition cycles, wherein each of the deposition cycles comprises a deposition step followed by a thin-down step.

20. The method of claim 19, wherein the deposition step is performed using $BCl_3$ gas, $H_2$ gas, and Ar gas, while the thin-down step is performed using Ar gas without using $BCl_3$ gas and $H_2$ gas.

* * * * *